(12) United States Patent
Yasukawa et al.

(10) Patent No.: US 8,133,597 B2
(45) Date of Patent: Mar. 13, 2012

(54) ORGANIC ELECTROLUMINESCENT DEVICE, DISPLAY AND ILLUMINATING DEVICE

(75) Inventors: Noriko Yasukawa, Tokyo (JP); Eisaku Katoh, Tokyo (JP); Tomohiro Oshiyama, Tokyo (JP); Shinya Otsu, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 917 days.

(21) Appl. No.: 12/065,392

(22) PCT Filed: Aug. 18, 2006

(86) PCT No.: PCT/JP2006/316209

§ 371 (c)(1),
(2), (4) Date: Feb. 29, 2008

(87) PCT Pub. No.: WO2007/029466

PCT Pub. Date: Mar. 15, 2007

(65) Prior Publication Data

US 2009/0160318 A1     Jun. 25, 2009

(30) Foreign Application Priority Data

Sep. 6, 2005 (JP) ................................. 2005-257603

(51) Int. Cl.
  H01L 51/54     (2006.01)
  C09K 11/06     (2006.01)

(52) U.S. Cl. ........ 428/690; 428/917; 313/504; 313/506; 257/E51.044; 546/4

(58) Field of Classification Search .................... None
See application file for complete search history.

(56) References Cited

U.S. PATENT DOCUMENTS

| | | | | |
|---|---|---|---|---|
| 2002/0034656 A1* | 3/2002 | Thompson et al. | ........... | 428/690 |
| 2003/0235712 A1* | 12/2003 | Takiguchi et al. | ........... | 428/690 |
| 2004/0137267 A1* | 7/2004 | Igarashi et al. | ........... | 428/690 |
| 2005/0249970 A1* | 11/2005 | Suzuri et al. | ........... | 428/690 |
| 2007/0184301 A1* | 8/2007 | Oshiyama et al. | ........... | 428/690 |
| 2007/0196687 A1* | 8/2007 | Oshiyama et al. | ........... | 428/690 |

FOREIGN PATENT DOCUMENTS

| | | |
|---|---|---|
| JP | 2001247859 | 9/2001 |
| JP | 2002117978 | 4/2002 |
| JP | 2002226495 | 8/2002 |
| JP | 2002234894 | 8/2002 |
| JP | 2002332291 | 11/2002 |
| JP | 2002332292 | 11/2002 |
| JP | 2002338588 | 11/2002 |
| JP | 2003073388 | 3/2003 |
| JP | 2003081988 | 3/2003 |
| JP | 2003123982 | 4/2003 |
| JP | 2003146996 | 5/2003 |
| JP | 2003192691 | 7/2003 |
| JP | 2003272861 | 9/2003 |
| JP | 2004221065 | 8/2004 |
| JP | 2005-060374 | 3/2005 |
| JP | 2005068110 | 3/2005 |
| JP | 2005097549 | 4/2005 |
| JP | 2005100881 | 4/2005 |
| JP | 2005129478 | 5/2005 |
| JP | 2005220136 | 8/2005 |
| JP | 2005276799 | 10/2005 |
| JP | 2006120762 | 5/2006 |
| JP | 2006120905 | 5/2006 |
| JP | 2006182921 | 7/2006 |
| JP | 2006193546 | 7/2006 |
| JP | 2006306807 | 11/2006 |
| WO | 0215645 | 2/2002 |
| WO | 03084972 | 10/2003 |
| WO | 03099959 | 12/2003 |
| WO | 2004016711 | 2/2004 |
| WO | 2004004610 | 11/2004 |
| WO | WO 2004/095889 A1 * | 11/2004 |
| WO | WO 2005/083033 A1 * | 9/2005 |
| WO | WO 2005/097940 A1 * | 10/2005 |
| WO | 2005123873 | 12/2005 |
| WO | 2006098209 | 9/2006 |
| WO | 2006103874 | 10/2006 |

OTHER PUBLICATIONS

Machine translation of JP 2005-068110 (Mar. 2005).*
Brooks et al., "Synthesis . . . Platinum Complexes", Inorganic Chemistry, 41, 12, pp. 3055-3066 (2002).
Adachi et al., "Endothermic energy transfer . . . ", Applied Physics Letters, 79, 13, pp. 2082-2084 (2001).
Holmes et al., "Efficient, deep-blue . . . ", Applied Physics Letters, 83,18, pp. 3818-3820 (2003).
Adamovich et al., "High efficiency single dopant . . . ", New Journal of Chemistry, 26, pp. 1171-1178 (2002).

* cited by examiner

Primary Examiner — Marie R. Yamnitzky
(74) Attorney, Agent, or Firm — Lucas & Mercanti, LLP

(57) ABSTRACT

Disclosed is an organic EL device having high luminous efficiency and long emission life, wherein emission wavelength is controlled. Also disclosed are an illuminating device and a display. Specifically disclosed is an organic electroluminescent device containing at least a light-emitting layer sandwiched between an anode and a cathode. This organic electroluminescent device is characterized in that the light-emitting layer contains a metal complex having a partial structure represented by the following general formula (1).

General formula (1)

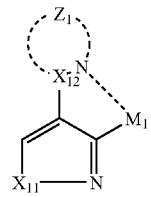

6 Claims, 3 Drawing Sheets

LIGHT

ORGANIC ELECTROLUMINESCENT DEVICE, DISPLAY AND ILLUMINATING DEVICE

This is a U.S. National Phase Application under 35 U.S.C. 371 of International Application PCT/JP2006/316209, filed on Aug. 18, 2006.

This Application claims the priority of Japanese Patent Application No. 2005-257603 filed on Sep. 6, 2005, the entire content of which is hereby incorporated by reference.

TECHNICAL FIELD

The present invention relates to an organic electroluminescent device, a display and an illuminating device.

TECHNICAL BACKGROUND

Hitherto, electroluminescent displays, hereinafter referred to as LED, have been used as a light emission type electron displaying device. As the device for constituting ELD, inorganic electroluminescent devices and organic electroluminescent devices, hereinafter referred to as organic EL device, are cited. The inorganic electroluminescent devices have been used as a flat light source. However, alternative high voltage is necessary for driving the light emission device. The organic EL device is constituted by a light emission layer containing a light emission compound placed between a cathode and an anode, which is a device emitting light by utilizing the light emission (fluorescence and phosphorescence) caused by quenching of an exciton generated by recombination of electrons and positive holes injected to the light emission layer, and the light can be emitted by applying voltage about several volts to several tens volts. The device is noted from the viewpoint of space saving and portability since which has wide viewing field and high visibility because the device is self light emission, type and is thin layer complete solid device.

However, development of an organic EL device capable of emitting light having higher brightness with higher efficiency and lower power consumption is demanded for practical applying of the organic EL element in the future.

Japanese Patent No. 3,039,796 describes that the improvement in the brightness of emitting light and prolongation of lifetime of the device can be attained by a stilbene derivative, distyrylarylene derivative or tristyrylarylene each doped with a slight amount of fluorescent substance.

Moreover, devices having an organic light emission layer composed of 8-hydroxyquinoline aluminum complex as host compound doped with a slight amount of fluorescent substance (cf. JP-A S63-264692 for example), and devices having an organic light emission layer composed of 8-hydroxyquinoline aluminum complex as host compound doped with a quinacridone type dye (cf. JP-A H03-255190, for example), have been known.

When light emission from the singlet excited state is used as above-mentioned, the ratio of generation ratio of the singlet excitons and the triplet excitons is 1:3. Therefore, the limit of externally taking out efficiency ($\eta_{ext}$) of light is 5% because the generation probability of the light emission exciton species is 25% and the taking out efficiency of light is 20%.

Besides, study on the materials emitting phosphorescence at room temperature is accelerated after disclosure of the report by Princeton University as to an organic device using light emission from the triplet excited state; cf. M. A. Baldo et al., Nature, 395, pp. 151 to 154 (1998).

Such the technology is also disclosed in, for example, M. A. Baldo et al., Nature, 403, 17, pp. 750 to 753 (2000) and U.S. Pat. No. 6,097,147. When the triplet excited state is utilized, the upper limit of internal quantum efficiency becomes 100%. Therefore, the light emission efficiency theoretically becomes 4 times of that of utilization of singlet excited state and a probability of obtaining performance almost the same of a cathode ray tube is caused so that such the device is noted as the use for illuminating device.

For example, many compounds, principally heavy metal complexes such as iridium complexes, are synthesized and investigated; cf. S. Lamansky et al., J. Am. Chem. Soc., 123, p. 4304 (2001).

In the above M. A. Baldo et al., Nature, 403, 17, pp. 750 to 753 (2000), the investigation is carried out using tris(2-phenylpridine)iridium as the dopant.

Other than the above, M. E. Tompson et al. investigate $L_2Ir(acac)$ such as $(ppy)_2Ir(acac)$ as the dopant; cf. The 10th International Workshop on Inorganic and Organic Electroluminescence (EL'00, Hamamatsu), and Moon-Jae Youn. Og, Tetsuo Tsutsui investigate using tris(2-(ptolyl)pyridine)iridium (Ir(ptpy)) or tris(benzo[h]quinoline)iridium $(Irbzq)_3)$ as the dopant; cf. The 10th International Workshop on Inorganic and Organic Electroluminescence (EL'00, Hamamatsu). These metal complexes are commonly called as ortho-metalized iridium complex.

In the above S. Lamansky et al., J. Am. Chem. Soc., 123, p. 4304 (2001), it is tried to make devices using various iridium complexes.

In the 10th International Workshop on Inorganic and Organic Electroluminescence (EL'00, Hamamatsu), Ike et al. uses a hole transfer compound as the host compound of a phosphorescent compound for obtaining high light emission efficiency. M. E. Tompson et al. uses various electron transfer materials doped with novel iridium complexes as the host of the phosphorescent compound.

Ortho-metal complexes having platinum atom as the central metal instead of iridium are also noted. As to such the kind of complexes, many examples are known, which are characterized by the ligand; cf. Patent publications 1 to 5 and Non-patent Publication 1, for example.

In the any cases, the brightness of emitted light and the light emission efficiency of the light emission device are considerably improved compared with conventional devices because the emitted light is originated from phosphorescence. However, there is a problem that the lifetime is shorter than that of the conventional devices. As above-mentioned, it is present state that the phosphorescent light emission material has not properties suitable for practical use because shortening in the wavelength of the emitted light and improving in the lifetime are difficult in such the device.

Regarding the shortening of the wavelength of emitting light, it is known to introduce an electron attractive group such as fluorine atom, trifluoromethyl group and cyano group as a substituent to phenylpyridine and to introduce a ligand such as picolinic acid and a pyrazabole type ligand; for example, cf. Patent Publications 6 to 10 and Non-patent Publications 1 to 4. By such the ligand, the wavelength of emitting light can be shortened so that a device capable of emitting blue light with high efficiency can be obtained but the light emission lifetime of the device is considerably shortened. Therefore, improvement of such the trade-off is demanded.

Patent Publication 1: JP-A 2002-332291
Patent Publication 2: JP-A 2002-332292
Patent Publication 3: JP-A 2002-338588
Patent Publication 4: JP-A 2002-226495
Patent Publication 5: JP-A 2002-234894

Patent Publication 6: WO 02/15645
Patent Publication 7: JP-A 2003-123982
Patent Publication 8: JP-A 2002-117978
Patent Publication 9: JP-A 2003-146996
Patent Publication 10: WO 04/016711
Non-patent Publication 1: Inorganic Chemistry, 41, 12, pp. 3055-3066 (2002)
Non-patent Publication 2: Applied physics Letters, 79, p. 2082 (2001)
Non-patent Publication 3: Applied physics Letters, 83, p. 3818 (2003)
Non-patent Publication 4: New Journal of Chemistry, 26, p. 1171 (2002)

DISCLOSURE OF THE INVENTION

Problems to be Solved by the Invention

An object of the invention is to provide an organic EL device having controlled wavelength of emitting light, high light emission efficiency and long lifetime of light emission, an illumination device and a display.

Means for Solving the Problems

The object of the invention is attained by the following constitutions (1) to (11).

(1) An organic luminescent device having at least a light emission layer placed between an anode and a cathode, wherein the light emission layer contains a metal complex having a partial structure represented by the following Formula (1).

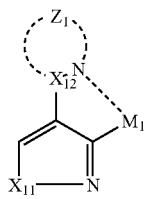

Formula (1)

In the above formula, $Z_1$ is a group of atoms necessary for forming an aromatic heterocyclic ring together with the N atom and $X_{12}$, $X_{11}$ is an oxygen atom or a sulfur atom, $X_{12}$ is a carbon atom or a nitrogen atom, and $M_1$ is a metal element of Group VIII to Group X of the periodic table.

(2) An organic luminescent device having at least a light emission layer placed between an anode and a cathode, wherein the light emission layer contains a metal complex having a partial structure represented by the following Formula (2).

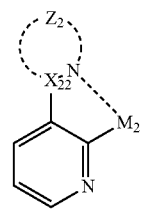

Formula (2)

In the formula, $Z_2$ is a group of atoms necessary for forming an aromatic heterocyclic ring together with the N atom and $X_{22}$, $X_{22}$ is a carbon atom or a nitrogen atom, and $M_2$ is a metal element of Group VIII to Group X of the periodic table.

(3) An organic luminescent device having at least a light emission layer placed between an anode and a cathode, wherein the light emission layer contains a metal complex having a partial structure represented by the following Formula (3).

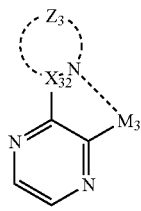

Formula (3)

In the formula, $Z_3$ is a group of atoms necessary for forming an aromatic heterocyclic ring together with the N atom and $X_{32}$, $X_{32}$ is a carbon atom or a nitrogen atom, and $M_3$ is a metal element of Croup VIII to Group X of the periodic table.

(4) An organic luminescent device having at least a light emission layer placed between an anode and a cathode, wherein the light emission layer contains a metal complex having a partial structure represented by the following Formula (4).

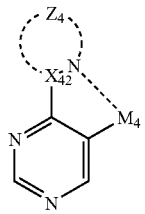

Formula (4)

In the formula, $Z_4$ is a group of atoms necessary for forming an aromatic heterocyclic ring together with the N atom and $X_{42}$, $X_{42}$ is a carbon atom or a nitrogen atom, and $M_4$ is a metal element of Group VIII to Group X of the periodic table.

(5) An organic luminescent device having at least a light emission layer placed between an anode and a cathode, wherein the light emission layer contains a metal complex having a partial structure represented by the following Formula (5).

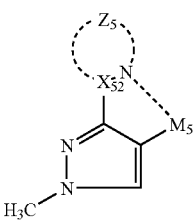

Formula (5)

In the formula, $Z_5$ is a group of atoms necessary for forming an aromatic heterocyclic ring together with the N atom and $X_{52}$, $X_{52}$ is a carbon atom or a nitrogen atom, and $M_5$ is a metal element of Group VIII to Group X of the periodic table.

(6) An organic luminescent device having at least a light emission layer placed between an anode and a cathode, wherein the light emission layer contains a metal complex having a partial structure represented by the following Formula (6).

Formula (6)

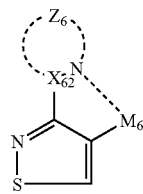

In the formula, $Z_6$ is a group of atoms necessary for forming an aromatic heterocyclic ring together with the N atom and $X_{62}$, $X_{62}$ is a carbon atom or a nitrogen atom, and MG is a metal element of Group VIII to Group X of the periodic table.

(7) An organic luminescent device having a light emission layer placed between an anode and a cathode, wherein the light emission layer contains a metal complex having a partial structure represented by the following Formula (7).

Formula (7)

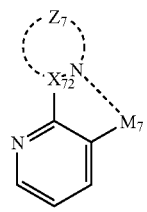

In the formula, $Z_7$ is a group of atoms necessary for forming an aromatic heterocyclic ring together with the N atom and $X_{72}$, $X_{72}$ is a carbon atom or a nitrogen atom, and $M_7$ is a metal element of Group VIII to Group X of the periodic table.

(8) The organic luminescent device described in any one of (1) to (7), wherein the metal element of Group VIII to Group X is iridium or platinum.

(9) The organic luminescent device described in any one of (1) to (8), which comprises a positive hole blocking layer placed between the light emission layer and the cathode as a constitution layer, wherein the positive hole blocking layer contains a carboline derivative or a derivative having a ring structure in which at least one of the carbon atoms of the hydrocarbon ring constituting the carboline ring of the carboline derivative is substituted by a nitrogen atom.

(10) A display having the electroluminescence device described in the above (1) to (9).

(11) An illumination device having the electroluminescence device described in the above (1) to (9).

Effects of the Invention

The organic electroluminescent device having high light emission efficiency and long light emission lifetime, the illumination device and the display can be provided by the invention.

DESCRIPTION OF SYMBOLS

Figure 1:
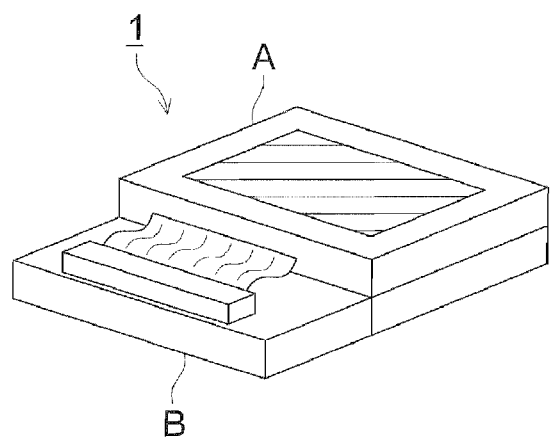
FIG. 1 is a schematic drawing of an example of display constituted by the organic EL devices.

1: Display
3: Pixel
5: Scanning line
6: Data line
7: Power source line
10: Organic EL device
11: Switching transistor
12: Driving transistor
13: Condenser
A: Display section
B: Control section
107: Glass substrate having transparent electrode
106: Organic EL layer
105: Cathode
102: Glass cover
108: Nitrogen gas
109: Moisture capturing agent

THE BEST EMBODIMENT FOR EMBODYING THE INVENTION

In the invention, it is under stood that the organic EL device having high externally taking out quantum efficiency and prolonged light emission lifetime can be obtained by the constitution described in anyone of the preceding (1)-(9). It is also succeeded to obtain the display and illumination device having high brightness by using the organic EL device.

As a result of investigation by the inventors on the above-mentioned problems, it is found that the problem of light emission lifetime of the usual blue light emitting metal complexes can be considerably improved by the organic device containing the metal complex having the partial structure represented by one of Formulas (1) to (7) so that the light emission efficiency and the light emission lifetime can be made compatible.

The organic EL device, illumination device and display having high light emission efficiency and prolonged lifetime can be provided by using such the organic EL device material.

The detail of each of the constituting elements of the invention is described below.

<<Metal Complex>>

The metal complex relating to the organic EL device of the invention has a partial structure represented by one of Formulas (1) to (7). The partial structure is described below.

<<The Partial Structure Represented by One of Formulas (1) to (7)>>

In Formulas (1) to (7), $Z_1$, $Z_2$, $Z_3$, $Z_4$, $Z_5$, $Z_6$ and $Z_7$ are each as a group of atoms necessary to form an aromatic heterocyclic ring together with, the N atom and $X_{12}$, the N atom and $X_{22}$, the N atom and $X_{32}$, the N atom and $X_{42}$, the N atom and $X_{52}$, the N atom and $X_{62}$, or the N atom and $X_{72}$, respectively. As the aromatic heterocyclic ring, imidazole, pyrazole, oxazole, thiazole, triazole, tetrazole, pyridine, pyridazine, pyrimidine, pyrazine and triazine are cited.

The aromatic heterocyclic ring may has a substituent; examples of the substituent include an alkyl group such as methyl group, ethyl group, propyl group, isopropyl group and tert-butyl group; a cycloalkyl group such as cyclopentyl group and cyclohexyl group; an alkenyl group such as vinyl group and allyl group; an alkynyl group such as ethynyl group; an aromatic hydrocarbon group (an aromatic carbon ring or an aryl group) such as phenyl group and 2,6-dimethylphenyl group; an aromatic heterocyclic group (heteroaryl group) such as furyl group, thienyl group, pyridyl group, pyridazyl group, pyrimidyl group, pyrazyl group, triazyl group, imidazolyl group, pyrazolyl group, thiazolyl group, quinazolyl group and phthalazyl group; a heterocyclic group such as pyrrolidyl group, imidazolidyl group, morpholyl group, oxazolidyl group; an alkoxy group such as methoxy group and ethoxy group; a cycloalkoxy group such as cyclopentyloxy group and cyclohexyloxy group; an aryloxy group such as phenoxy group and naphthyloxy group; an alkylthio group such as methylthio group and ethylthio group, a cycloalkylthio group such as cyclopentylthio group and cyclohexylthio group; an arylthio group such as phenylthio group and naphthylthio group; an alkoxycarbonyl group such as methyloxycarbonyl group and ethyloxycarbonyl group; an aryloxycarbonyl group such as phenyloxycarbonyl group and naphthyloxycarbonyl group; a sulfamoyl group such as aminosulfonyl group, methylaminosulfonyl group and dimethylaminosulfonyl group; an acyl group such as acetyl group and ethylcarbonyl group; an acyloxy group such as acetyloxy group and ethylcarbonyloxy group; an amide group such as methylcarbonylamino group, ethylcarbonylamino group and dimethylcarbonylamino group; a carbamoyl group such as aminocarbonyl group, methylaminocarbonyl group and dimethylaminocarbonyl group; a ureido group such as methylureido group and ethylureido group, an amino group such as amino group, ethylamino group, dimethylamino group and diphenylamino group; a halogen atom such as fluorine atom, chlorine atom and bromine atom; a fluorohydrocarbon group such as fluoromethyl group and trifluoromethyl group; a cyano group; a nitro group; a hydroxyl group; a mercapto group and silyl group such as trimethylsilyl group.

In Formulas (1) to (7), $M_1$ to $M_7$ each represents a metal element of Groups VIII to V, preferably iridium, platinum, ruthenium or rhodium, and more preferably iridium or platinum.

Concrete examples of the metal complex having the partial structure represented by one of Formula (1) to (7) and isomer thereof are listed below.

1-1
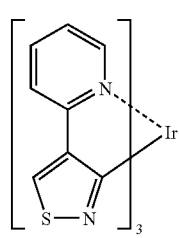

1-2
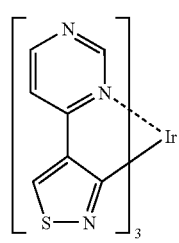

1-3
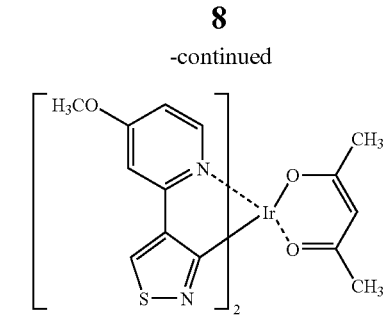

1-4
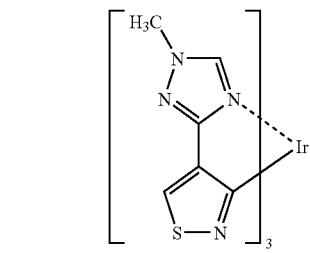

1-5
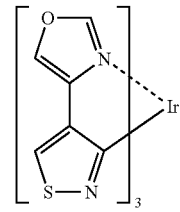

1-6
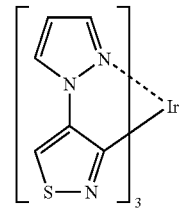

1-7
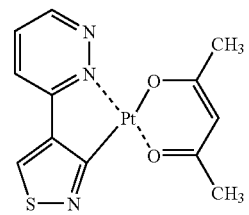

1-8
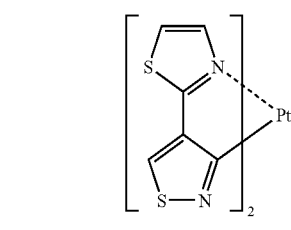

1-9
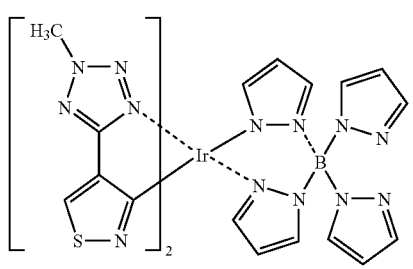

-continued
1-10
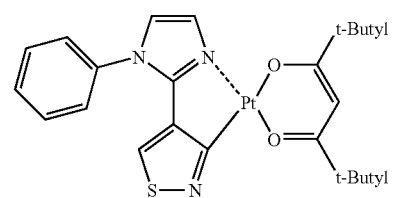
1-11
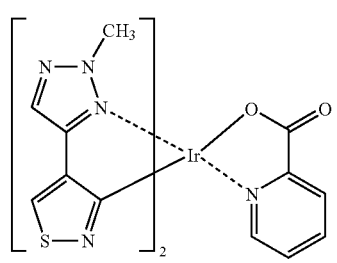
1-12
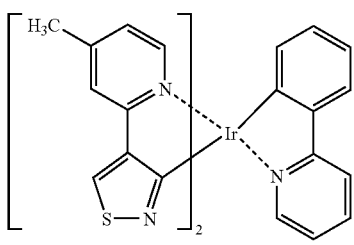
1-13
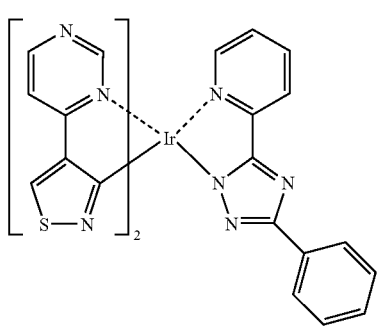
1-14
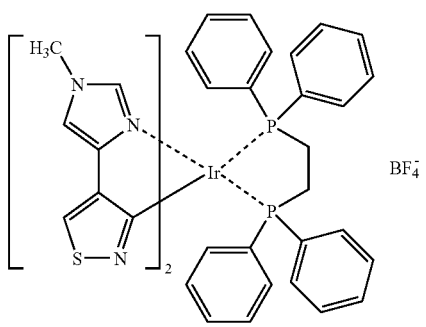
1-15
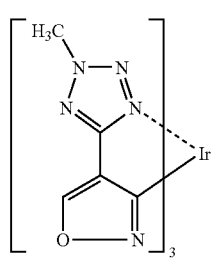
-continued
1-16
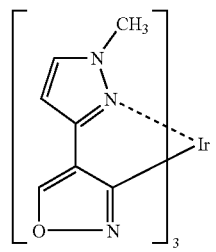
1-17
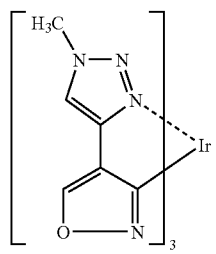
1-18
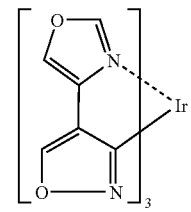
1-19
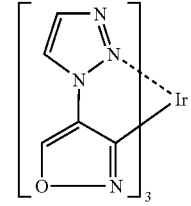
1-20
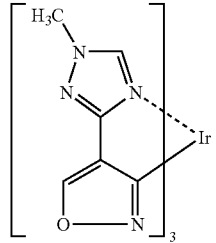
1-21
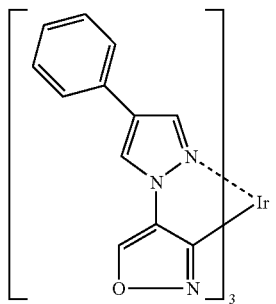

-continued
1-22
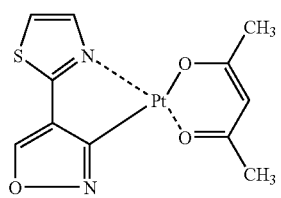
1-23
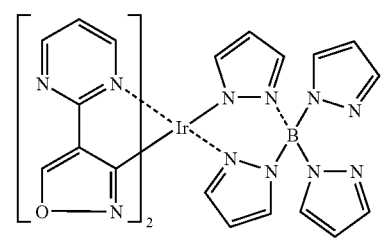
1-24
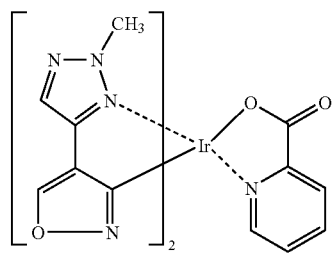
1-25
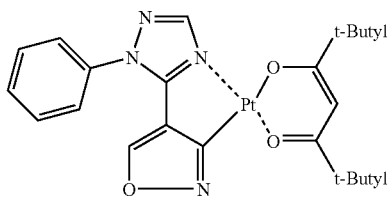
1-26
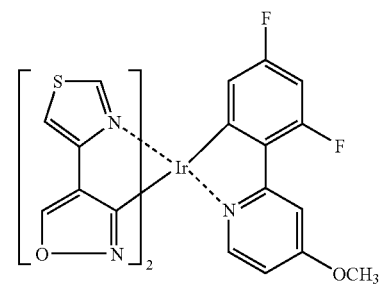
1-27
1-28
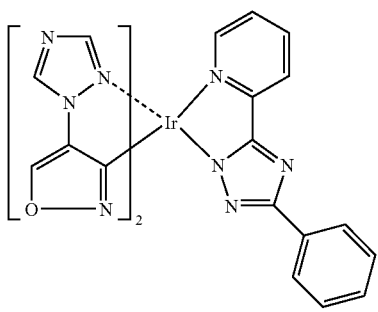
1-29
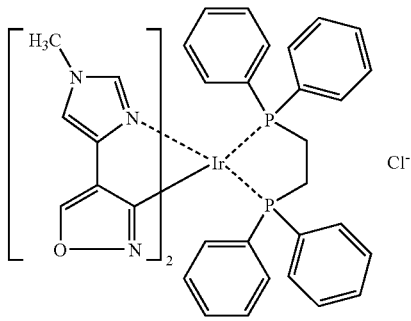
2-1
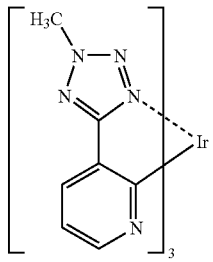
2-2
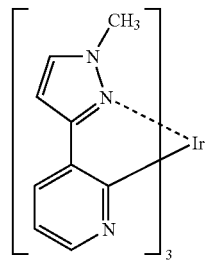
2-3
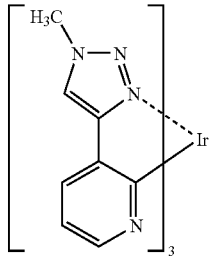

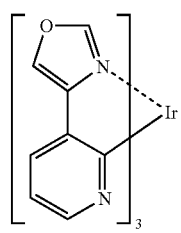
2-4
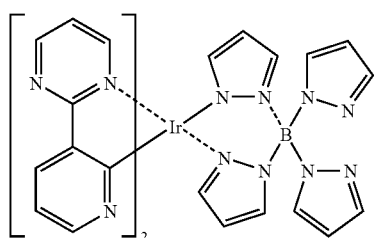
2-10
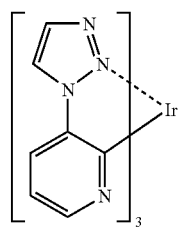
2-5
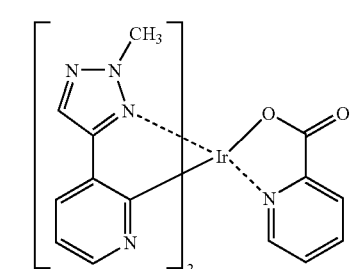
2-11
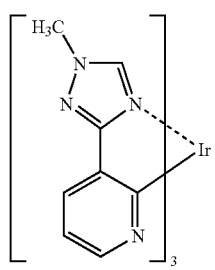
2-6
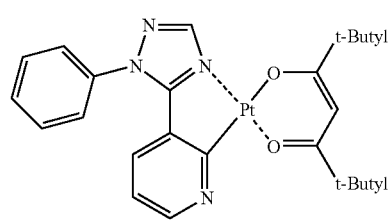
2-12
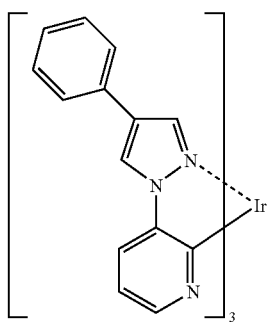
2-7
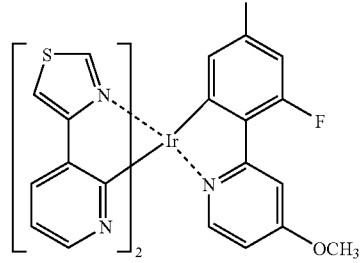
2-13
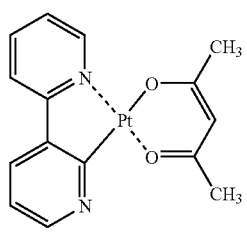
2-8
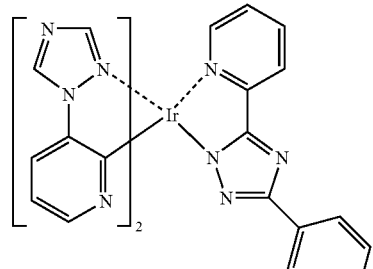
2-14
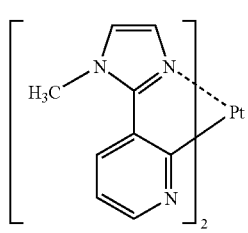
2-9
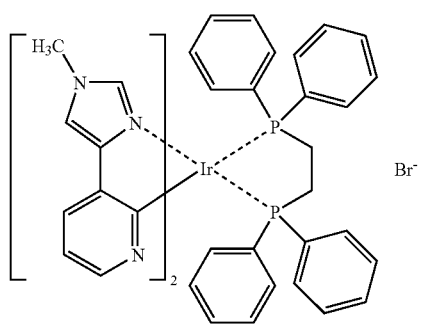
2-15

3-1
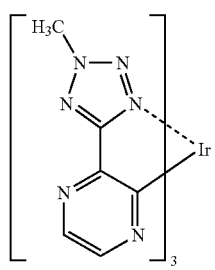
3-2
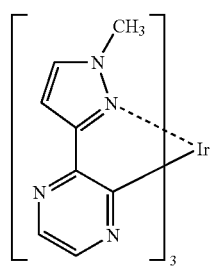
3-3
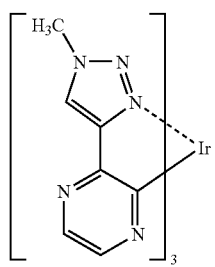
3-4
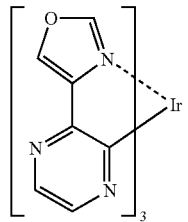
3-5
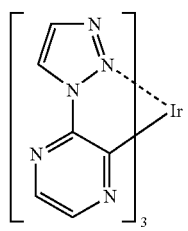
3-6
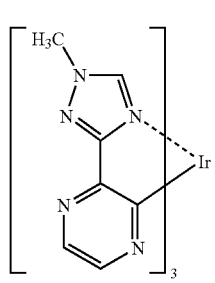
3-7
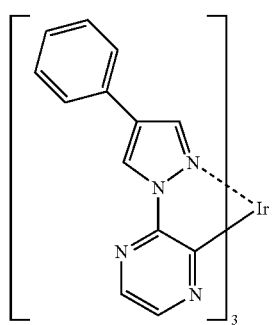
3-8
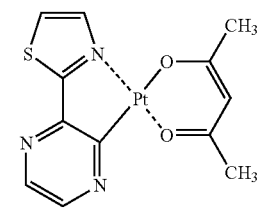
3-9
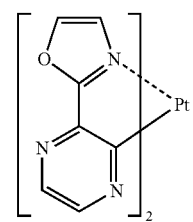
3-10
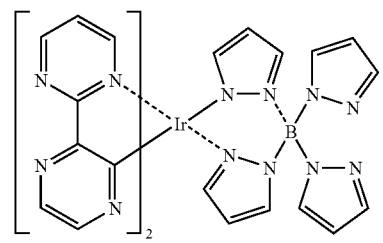
3-11
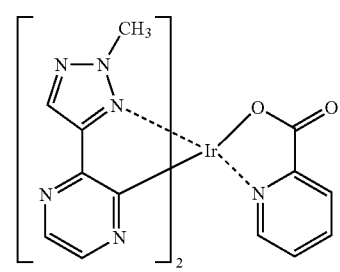
3-12
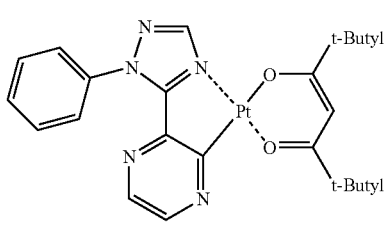

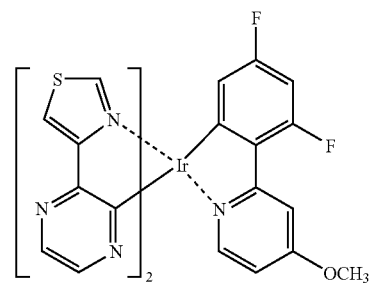
3-13
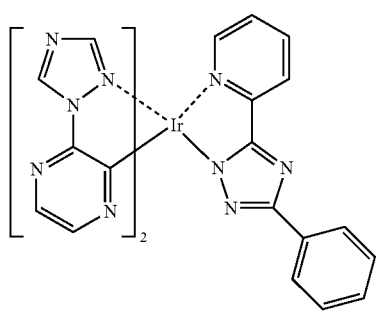
3-14
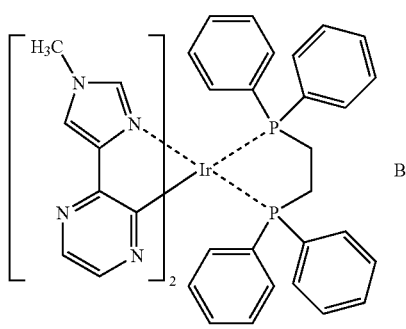
3-15
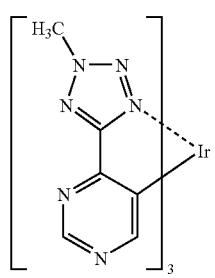
4-1
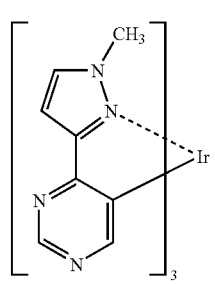
4-2
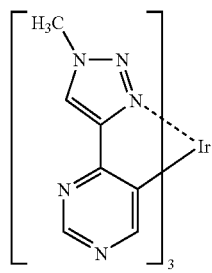
4-3
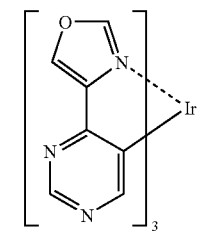
4-4
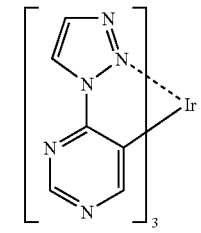
4-5
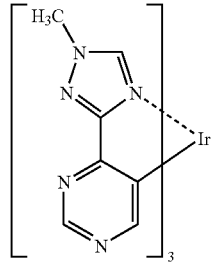
4-6
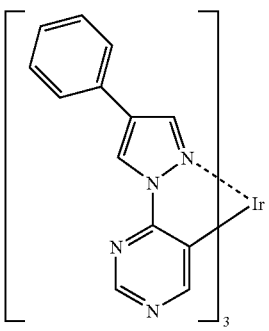
4-7
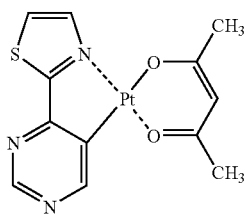
4-8

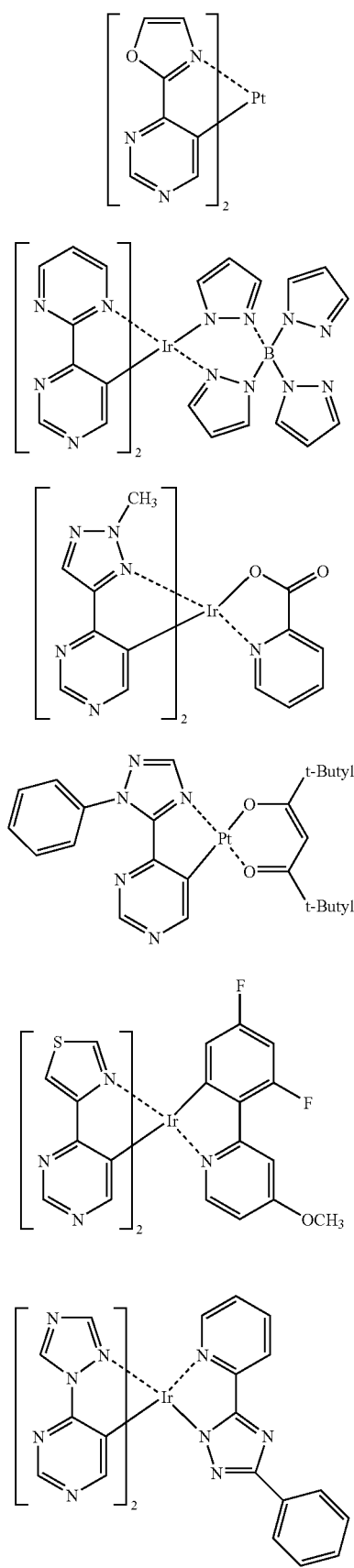
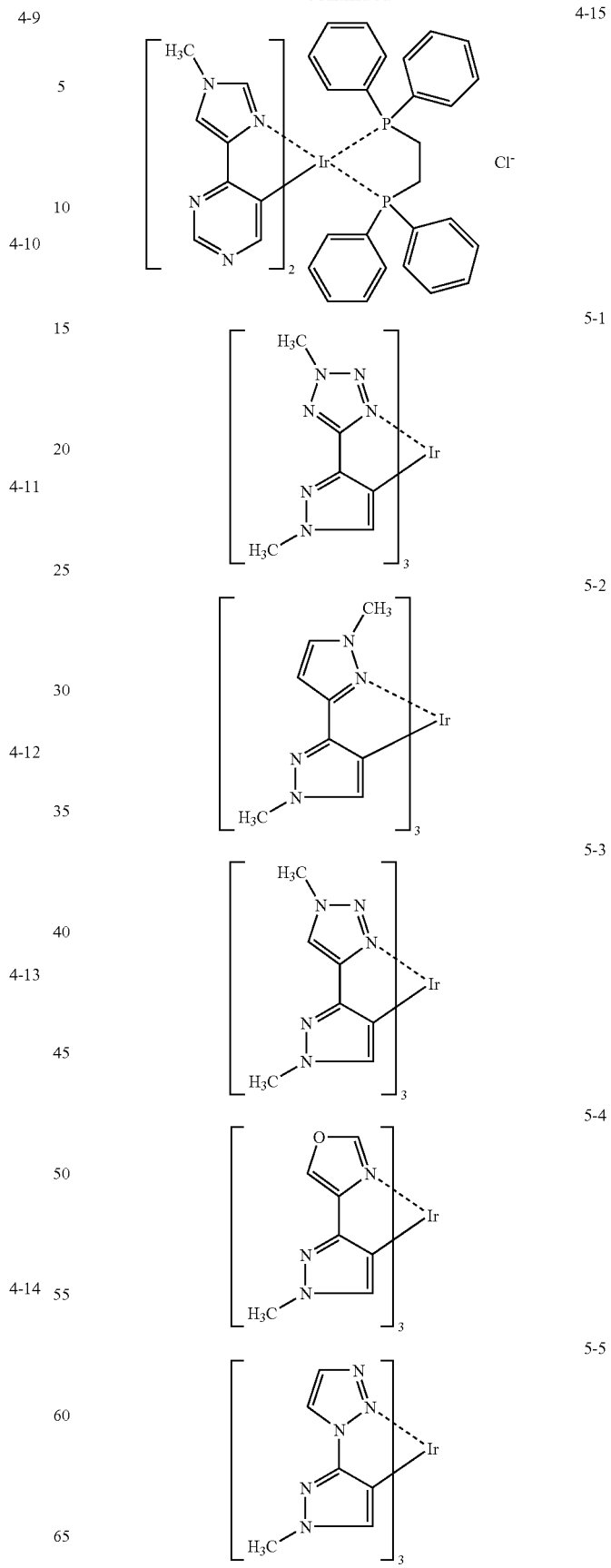

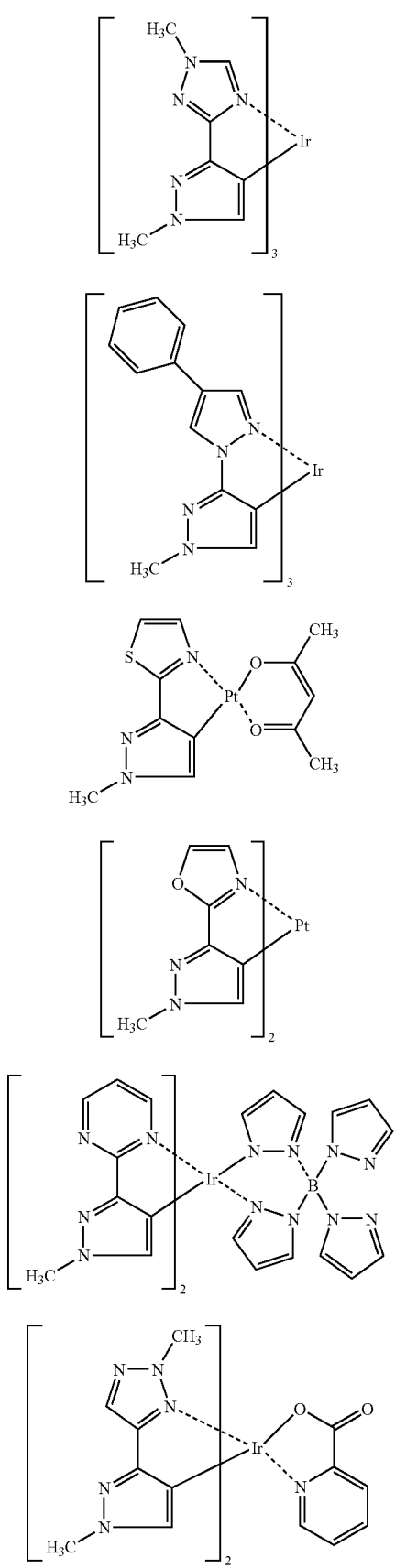
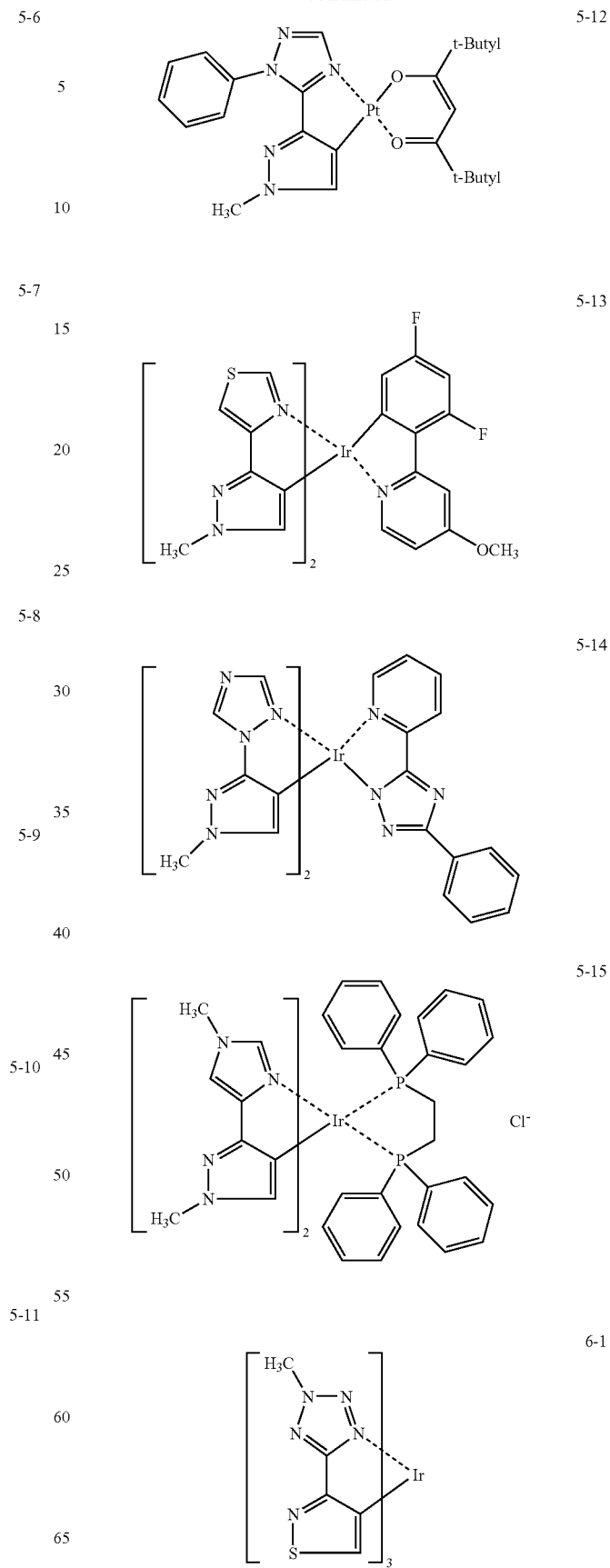

6-2 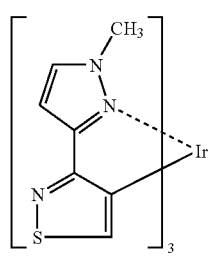
6-3 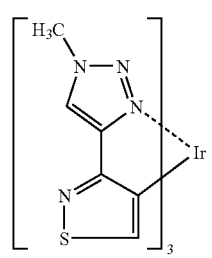
6-4 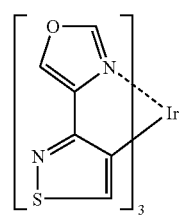
6-5 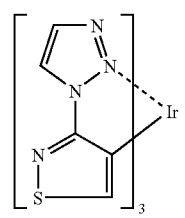
6-6 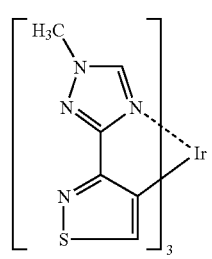
6-7 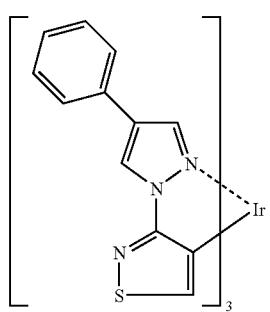
6-8 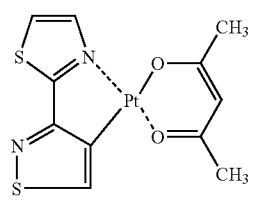
6-9 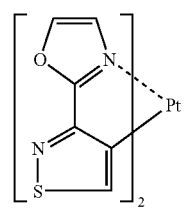
6-10 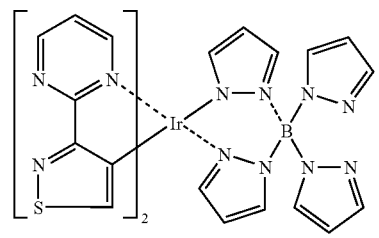
6-11 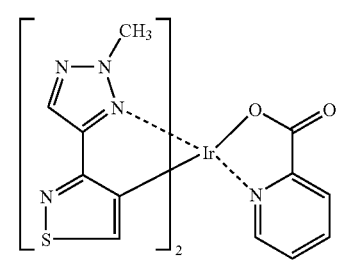
6-12 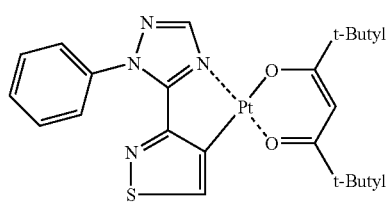
6-13 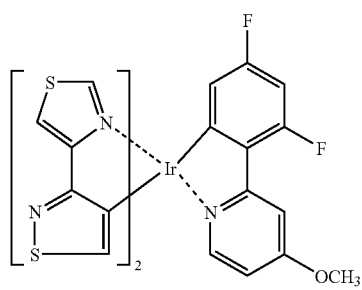

6-14
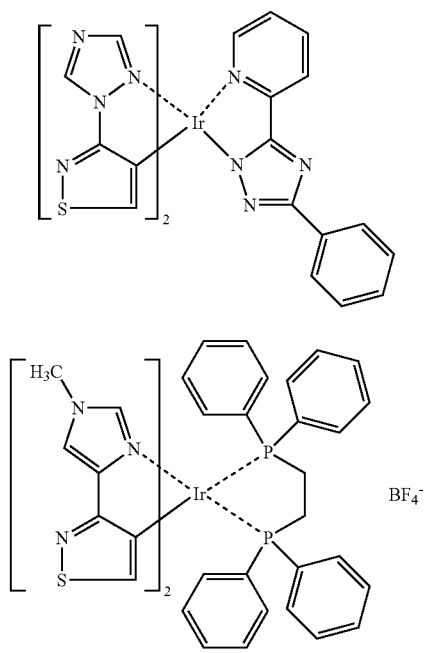
6-15
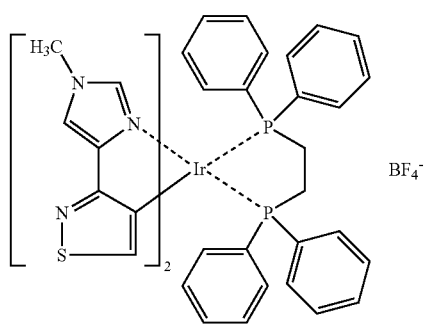 BF$_4^-$
7-1
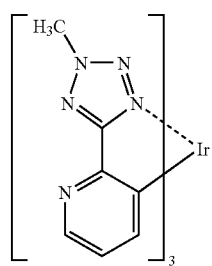
7-2
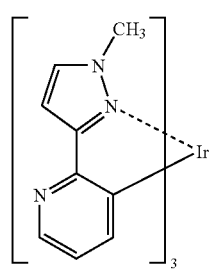
7-3
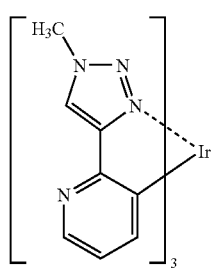
7-4
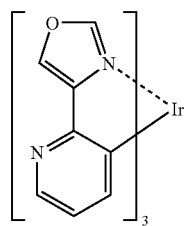
7-5
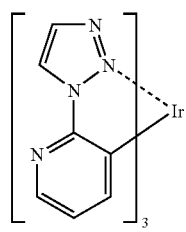
7-6
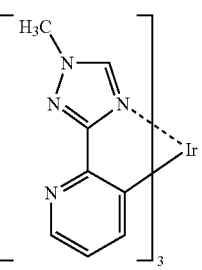
7-7
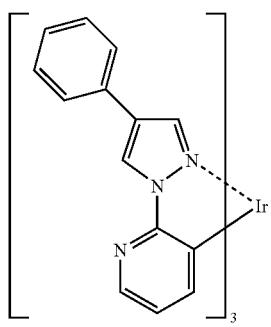
7-8
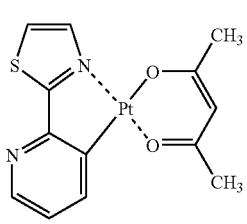
7-9
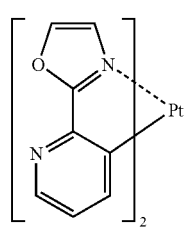

-continued

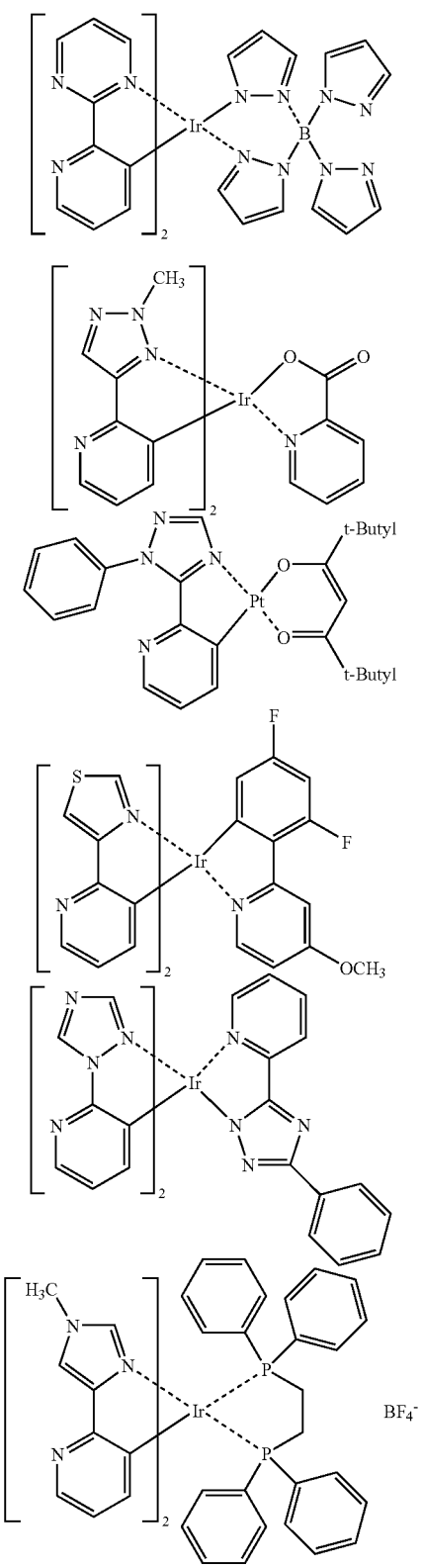

7-10

7-11

7-12

7-13

7-14

7-15

Metal complexes according to an organic EL element material of this invention, having the partial structure represented by one of Formula (1) to (7) and isomer thereof, can be synthesized by applying a method described in such as Organic Letter, vol. 3, No. 16, pp. 2579-2581 (2001), Inorganic Chemistry vol. 30, No. 8, pp. 1685-1687 (1991), J. Am. Chem. Soc., vol. 123, p. 4304 (2001), Inorganic Chemistry vol. 40, No. 7, pp. 1704-1711 (2001), Inorganic Chemistry vol. 41, No. 12, pp. 3055-3066 (2002), New Journal of Chemistry, vol. 26, p. 1171 (2002), Journal of the Chemical Society Perkin Transactions 1, 11, pp. 1505-1510 (1999), and reference documents described in these documents.

<Application of Organic EL Element Material Containing Metal Complex to Organic EL Element>

An emission layer is preferable to incorporate the metal complex having the partial structure represented by one of Formula (1) to (7) and isomer thereof. Improvement of externally taking out efficiency (higher illumination) and long lifetime of light emission of the organic EL element of the invention can be attained by employing as an emission dopant in the emission layer when it is employed in the emission layer.

(Emission Host and Emission Dopant)

It is preferable that the emission layer contains an emission host and an emission dopant. A mixing ratio of an emission dopant against an emission host as a primary component in an emission layer, is preferably adjusted to a range of 0.1-30 weight %.

In this instance, plural types of compounds may be utilized in combination as an emission dopant, and the partner to be mixed may be a metal complex having a different structure, and a phosphorescent dopant or a fluorescent dopant having other structures.

Here, a dopant (such as a phosphorescent dopant and a fluorescent dopant) which may be utilized together with a metal complex employed as an emission dopant will be described.

An emission dopant is roughly classified into two types, that is, a fluorescent dopant which emits fluorescence and a phosphorescent dopant which emits phosphorescence.

A typical example of the former (a fluorescent dopant) includes coumarin type dye, pyran type dye, cyanine type dye, croconium type dye, squarylium type dye, oxobenzanthracene type dye, fluorescein type dye, rhodamine type dye, pyrilium type dye, perylene type dye, stilbene type dye, polythiophene type dye or rare earth complex type fluorescent substances.

A typical example of the latter (a phosphorescent dopant) is preferably a complex type compound containing metal of the 8th-10th groups of the periodic table, more preferably an iridium compound and an osmium compound, and most preferable among them is an iridium compound.

The phosphorescent dopant (referred to phosphorescent compound or phosphorescent emission compound) employed in this invention is observed a light emission from excitation triplet state. Quantum efficiency of phosphorescent is 0.001 or more, more preferably 0.01 or more and particularly preferably 0.1 or more at 25° C.

The quantum efficiency is measured by a method described in Jikken Kagaku Koza (Lecture on Experimental Chemistry), Spectroscopy II, page 398, $4^{th}$ ed. (1992, Maruzen). The quantum efficiency of phosphoresce in liquid can be measured by employing various solvents, and it is allowable when the phosphoresce quantum efficiency is attained in any one of arbitral solvent.

Specifically, listed are compounds described in the following patent publication:

WO 00/70655, JP-A 2002-280178, JP-A 2001-181616, JP-A 2002-280179, JP-A 2001-181617, JP-A 2002-280180, JP-A 2001-247859, JP-A 2002-299060, JP-A 2001-313178, JP-A 2002-302671, JP-A 2001-345183, JP-A 2002-324679, WO 02/15645, JP-A 2002-332291, JP-A 2002-50484, JP-A 2002-322292, JP-A 2002-83684, JP-A 2002-540572, JP-A 2002-117978, JP-A 2002-338588, JP-A 2002-170684, JP-A 2002-352960, WO 01/93642, JP-A 2002-50483, JP-A 2002-100476, JP-A 2002-173674, JP-A 2002-359082, JP-A 2002-175884, JP-A 2002-363552, JP-A 2002-184582, JP-A 2003-7469, JP-A 2002-525808, JP-A 2003-7471, JP-A 2002-525833, JP-A 2003-31366, JP-A 2002-226495, JP-A 2002-234894, JP-A 2002-235076, JP-A 2002-241751, JP-A 2001-319779, JP-A 2001-319780, JP-A 2002-62824, JP-A 2002-100474, JP-A 2002-203679, JP-A 2002-343572, JP-A 2002-203678 and so on.
A part of examples thereof will be shown below.
Ir-1
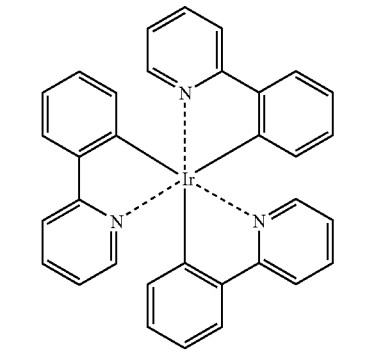
Ir-2
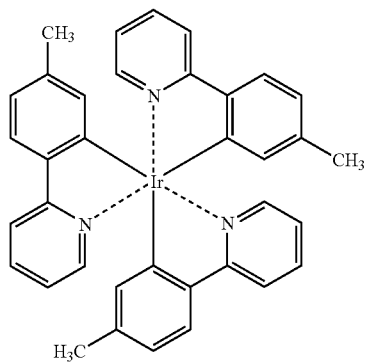
Ir-3
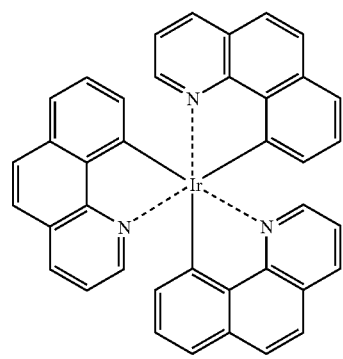
Ir-4
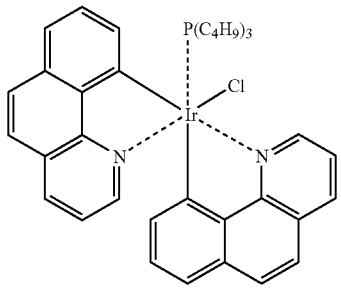
Ir-5
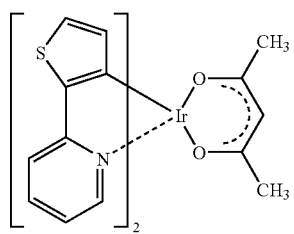
Ir-6
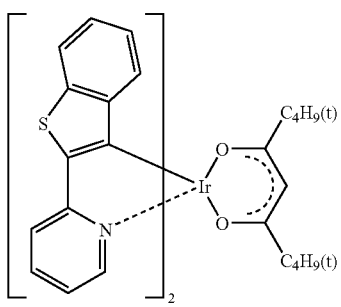
Ir-7
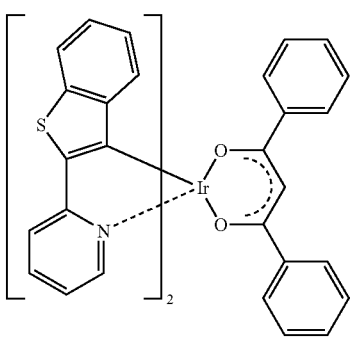
Ir-8
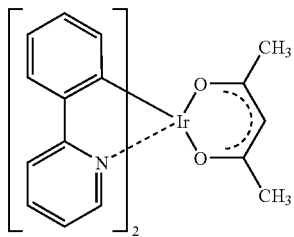

-continued

Ir-9
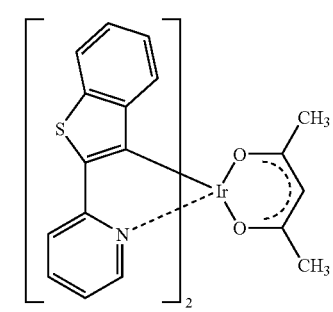

Ir-10
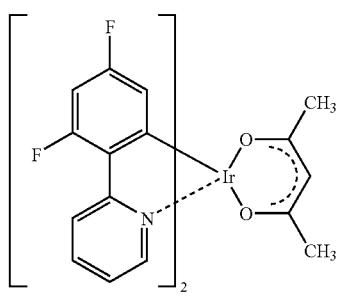

Ir-11
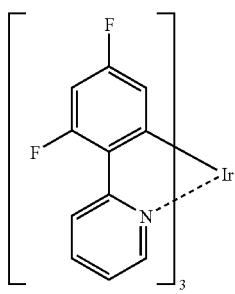

Ir-12
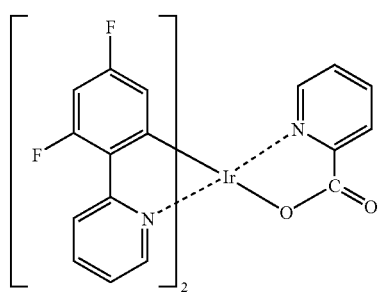

Ir-13
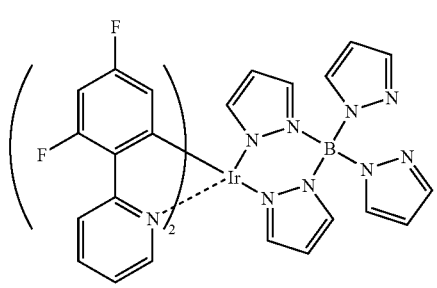

-continued

Pt-1
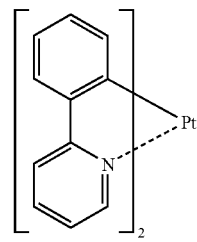

Pt-2
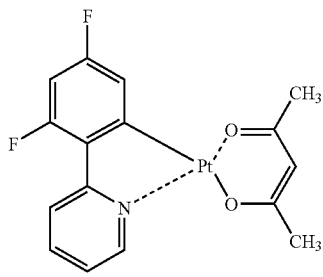

Pt-3
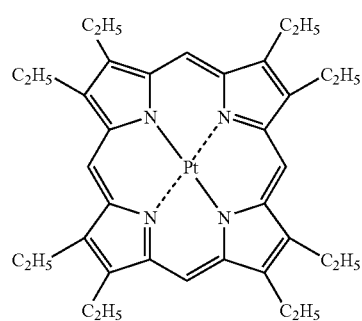

A-1
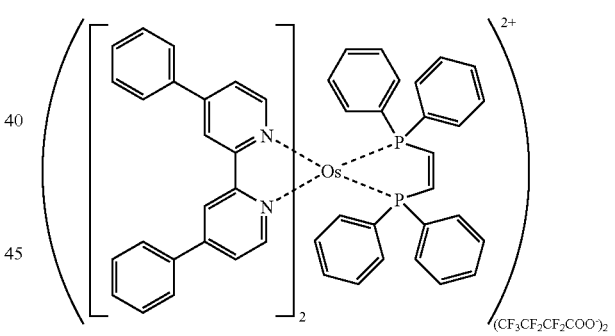

(Emission Host)

A host compound employed in this invention is a compound giving phosphorescence quantum efficiency in phosphorescence emission of not more than 0.01 at room temperature (25° C.).

An emission host utilized in this invention is preferably a compound having a phosphorescence 0-0 band of a wavelength not longer than that of an emission dopant utilized in combination, and when a compound having a blue emission component of a phosphorescence 0-0 band of not longer than 470 nm is utilized as an emission dopant, an emission host is preferably provided with a phosphorescence 0-0 band of not longer than 460 nm.

An emission host of this invention is not specifically limited with respect to the structure; and includes a low molecular weight compound, a polymer compound having recurring units, a low molecular compound having polymerizable monomer group such as vinyl or epoxy group. An emission host is preferably a compound having a positive hole transporting ability and an electron transporting ability, as well as preventing elongation of an emission wavelength and having a high Tg (a glass transition temperature).

An example of the emission host of this invention includes typically a compound provided with a basic skeleton such as a carbazole derivative, a triarylamine derivative, an aromatic borane derivative, a nitrogen-containing heterocyclic derivative, a thiophene derivative, a furan derivative and an oligoarylene compound, and a carboline derivative, or derivative having a carboline ring structure at least one of carbon atom of hydrocarbon ring of which is substituted by nitrogen atom.

As specific examples of an emission host, compounds described in the following Documents are preferable: For example, JP-A 2001-257076, JP-A 2002-308855, JP-A 2001-313179, JP-A 2002-319491, JP-A 2001-357977, JP-A 2002-334786, JP-A 2002-8860, JP-A 2002-334787, JP-A 2002-15871, JP-A 2002-334788, JP-A 2002-43056, JP-A 2002-334789, JP-A 2002-75645, JP-A 2002-338579, JP-A 2002-105445, JP-A 2002-343568, JP-A 2002-141173, JP-A 2002-352957, JP-A 2002-203683, JP-A 2002-363227, JP-A 2002-231453, JP-A 2003-3165, JP-A 2002-234888, JP-A 2003-27048, JP-A 2002-255934, JP-A 2002-260861, JP-A 2002-280183, JP-A 2002-299060, JP-A 2002-302516, JP-A 2002-305083, JP-A 2002-305084 and JP-A 2002-308837. Specific examples of an emission host are shown below; however, this invention is not limited thereto.

A typical constitution of an organic EL element will be described, below.

<Component Layers of Organic EL Element>

Component layers of an organic EL element of this invention will now be described.

Specific examples of a preferable layer constitution of an organic EL element of this invention are shown below; however, this invention is not limited thereto.

(i) anode/positive hole transport layer/emission layer/positive hole inhibition layer/electron transport layer/cathode,
(ii) anode/electron inhibition layer/emission layer/positive hole inhibition layer/electron transport layer/cathode,
(iii) anode/positive hole transport layer/electron inhibition layer/emission layer/positive hole inhibition layer/electron transport layer/cathode,
(iv) anode/anode buffer layer/positive hole transport layer/electron inhibition layer/emission layer/positive hole inhibition layer/electron transport layer/cathode,
(v) anode/positive hole transport layer/electron inhibition layer/emission layer/positive hole inhibition layer/electron transport layer/cathode buffer layer/cathode,
(vi) anode/anode buffer layer/positive hole transport layer/electron inhibition layer/emission layer/positive hole inhibition layer/electron transport layer/cathode buffer layer/cathode,
(vii) anode/anode buffer layer/positive hole transport layer/electron inhibition layer/emission layer/positive hole inhibition layer/electron transport layer/cathode buffer layer/cathode <Inhibition Layer (Electron Inhibition Layer, Positive Hole Inhibition Layer)>

The layer thickness of an inhibition layer according to this invention is preferably 3-100 nm and more preferably 5-30 nm.

<Positive Hole Inhibition Layer>

A positive hole inhibition layer, in a broad meaning, is provided with a function of electron transport layer, being comprised of a material having a function of transporting an electron but a very small ability of transporting a positive hole, and can improve the recombination probability of an electron and a positive hole by inhibiting a positive hole while transporting an electron.

As a positive inhibition layer, for example, a positive inhibition layer described in such as JP-A H11-204258 and JP-A H11-204359 and p 273 of "Organic EL Elements and Industrialization Front Thereof (Nov. 30 (1998), published by NTS. Inc.)" is applicable to a positive hole inhibition (hole block) layer according to this invention. Further, an arrangement of an electron transport layer described later can be appropriately utilized as a positive hole inhibition layer according to this invention.

The organic EL element of this invention has a hole inhibition layer as a component layer, and the hole inhibition layer preferably comprises a carboline derivative, or derivative having a carboline ring structure at least one of carbon atom of hydrocarbon ring of which is substituted by nitrogen atom mentioned above.

A preferable practical example is described below. The invention is not restricted thereto.

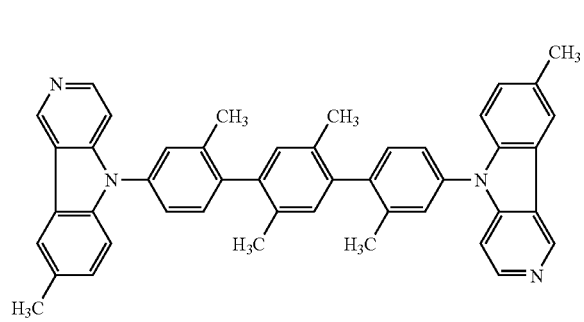

1

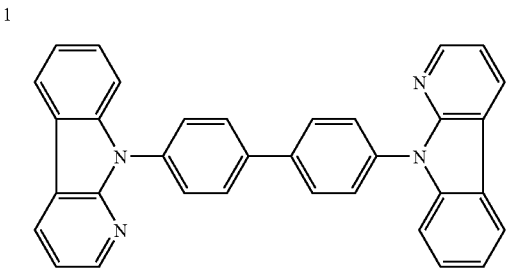

2

-continued
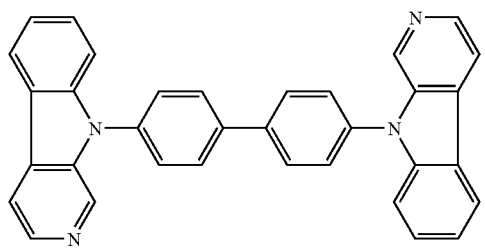
3
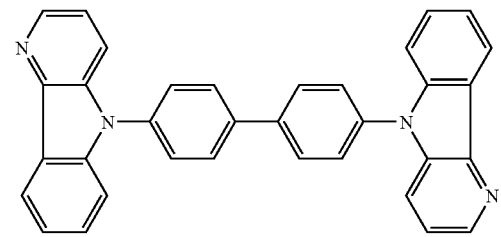
4
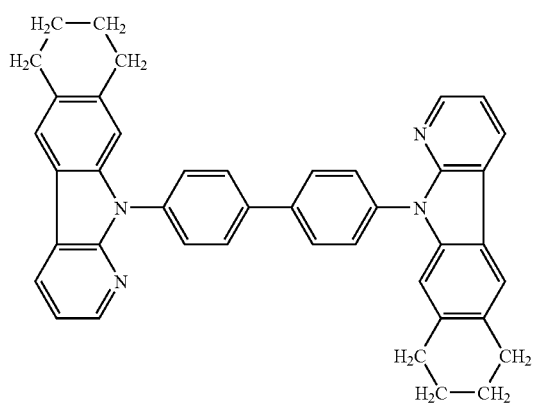
5
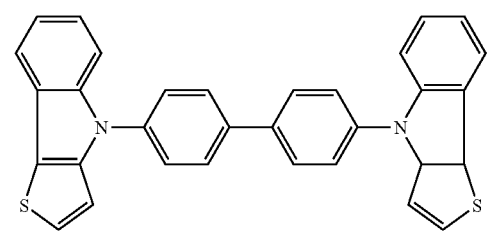
6
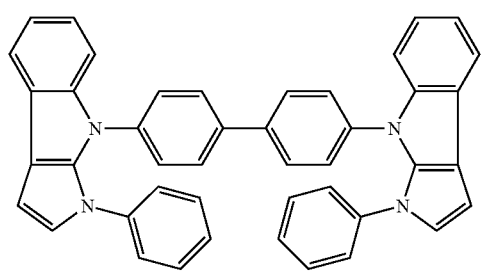
7
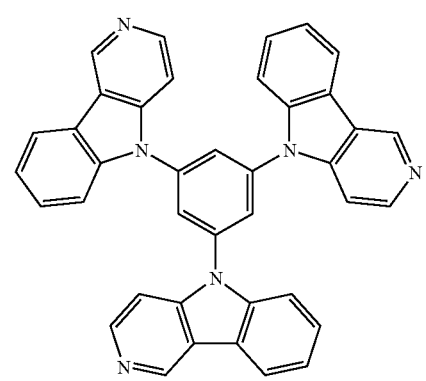
8
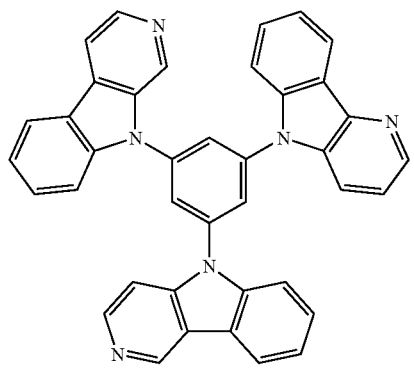
9
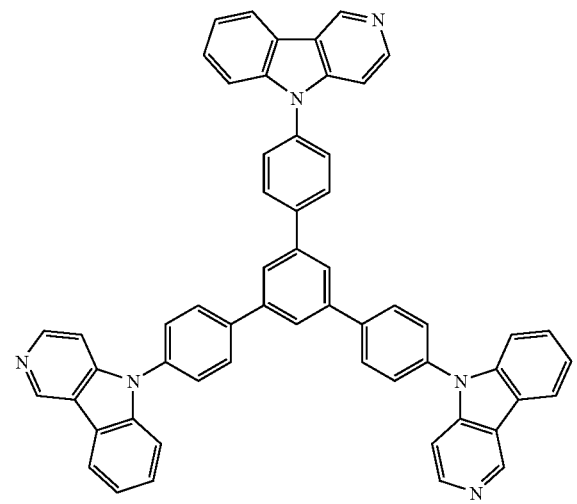
10

-continued
11
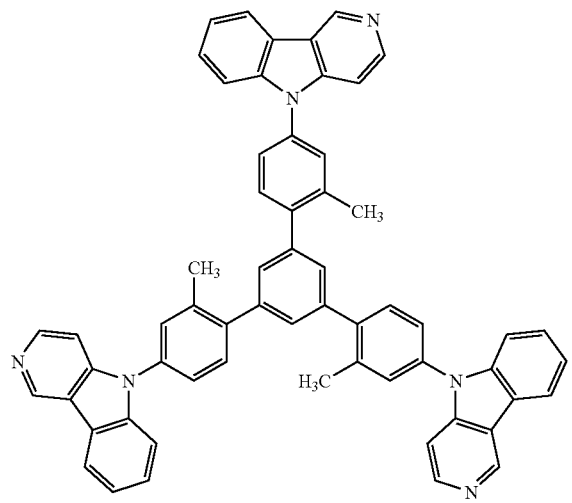
12
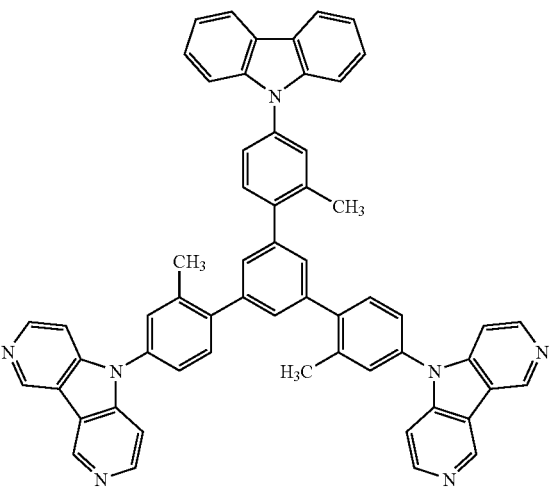
13
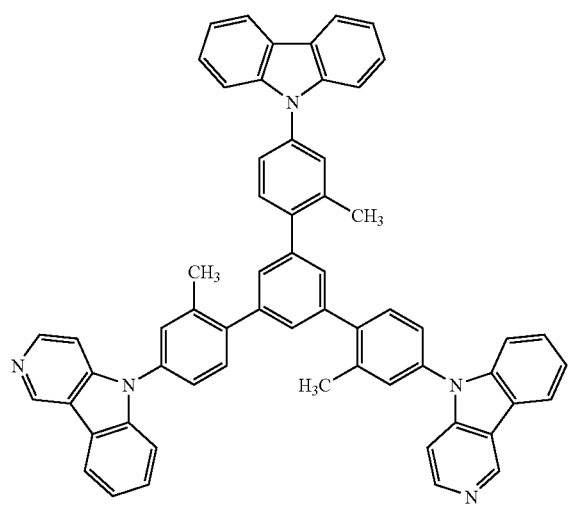
14
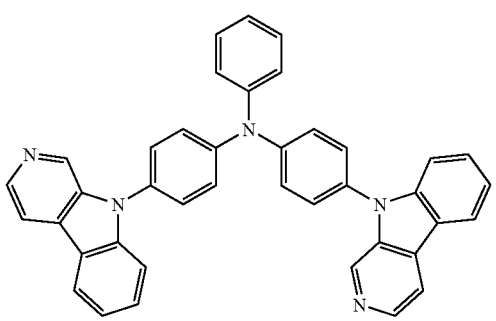
15
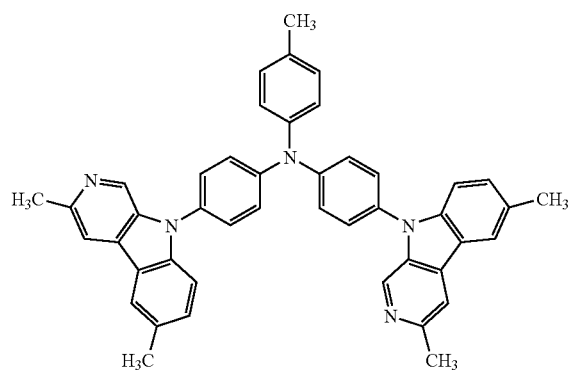
16
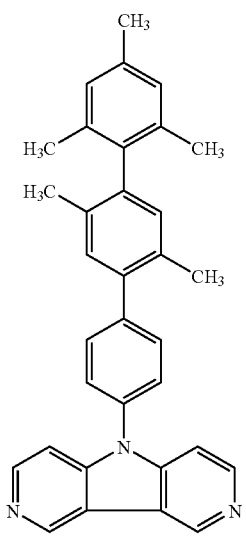

-continued
17
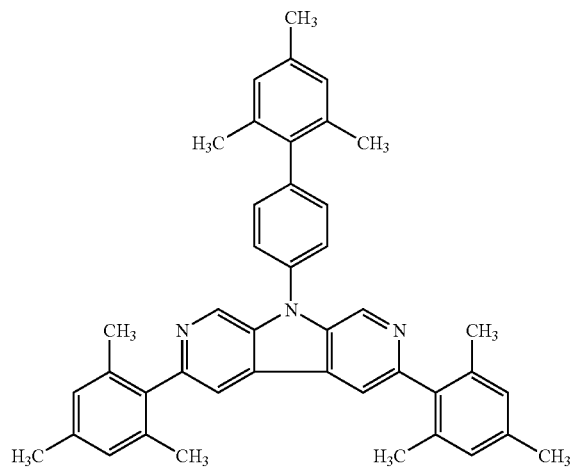
18
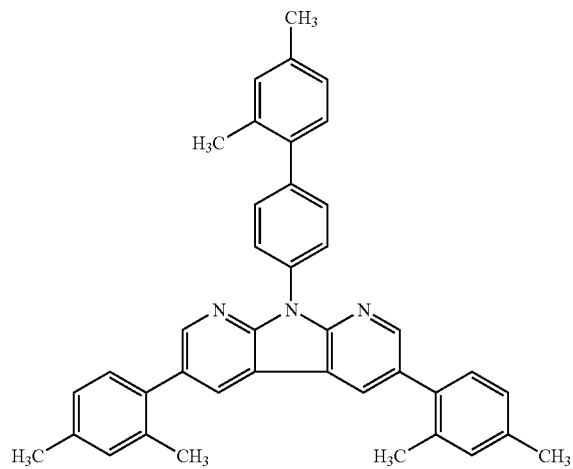
19
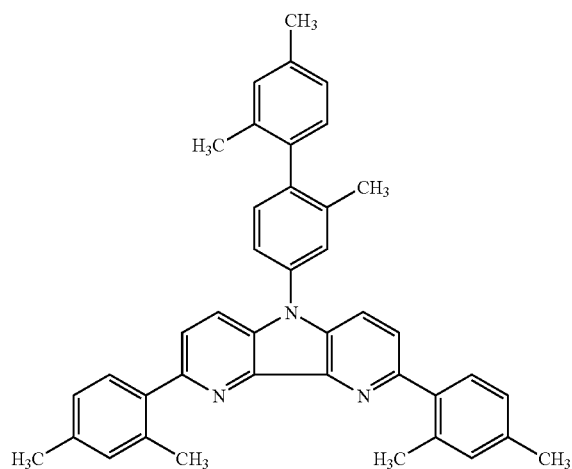
20
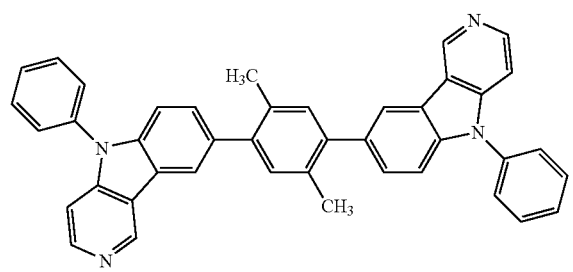
21
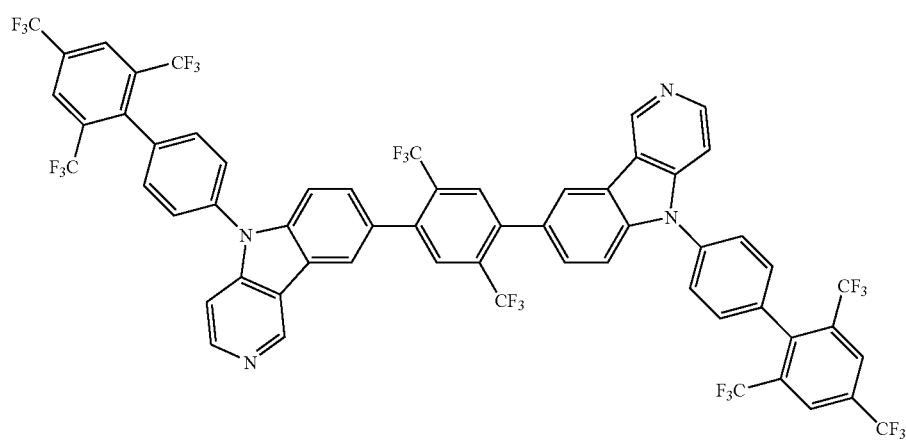

-continued
22
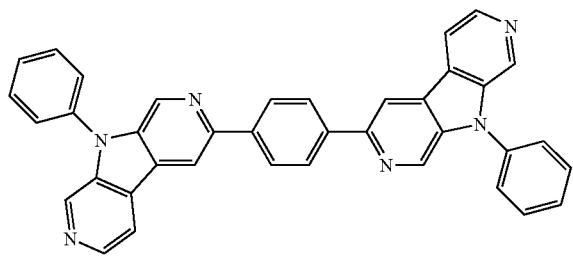
23
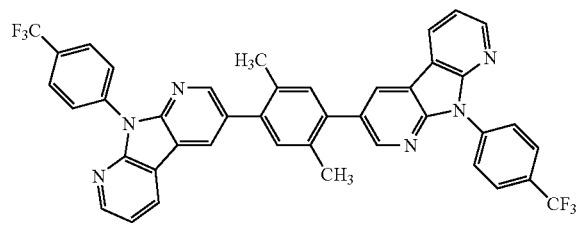
24
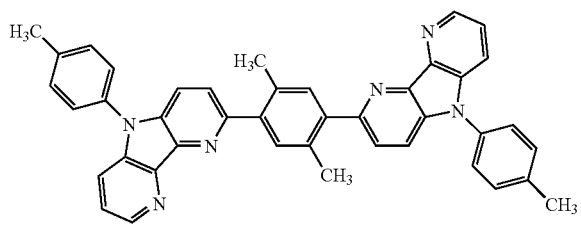
25
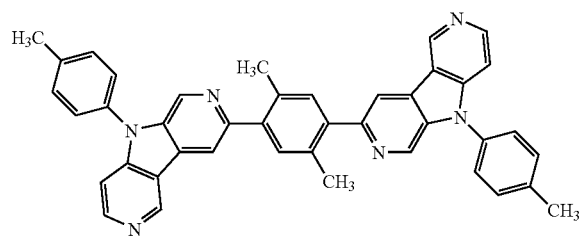
26
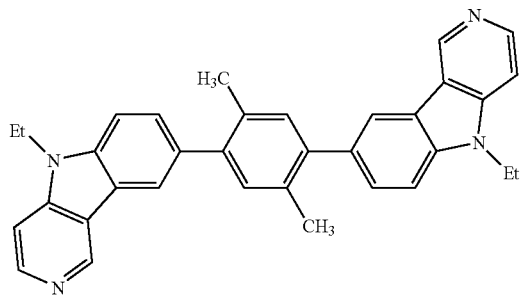
27
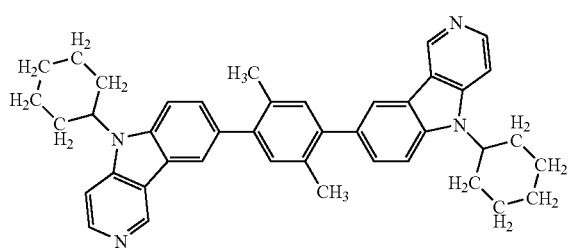
28
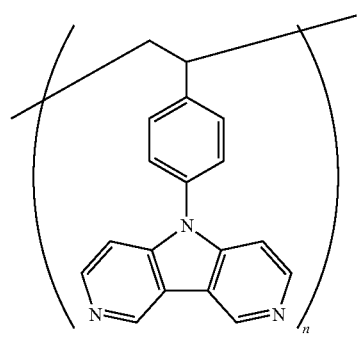
29
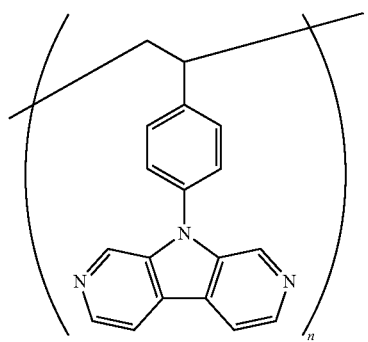
30
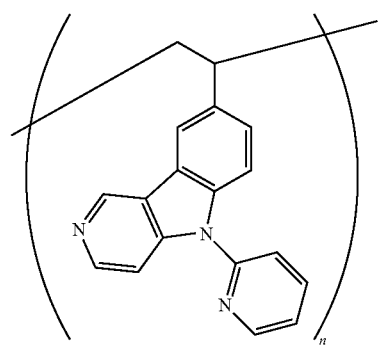
31

-continued
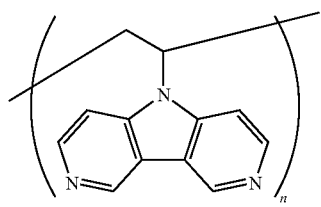
32
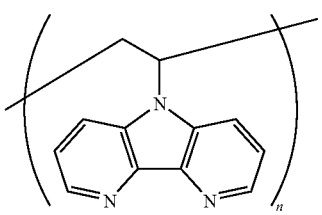
33
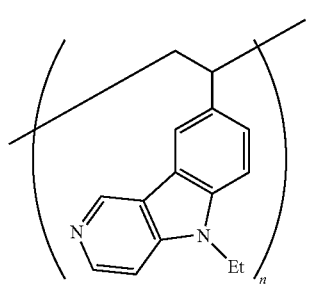
34
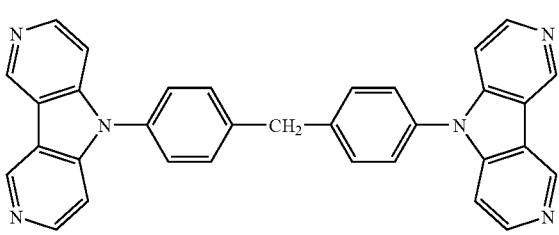
35
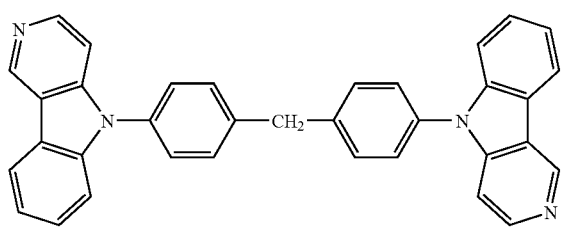
36
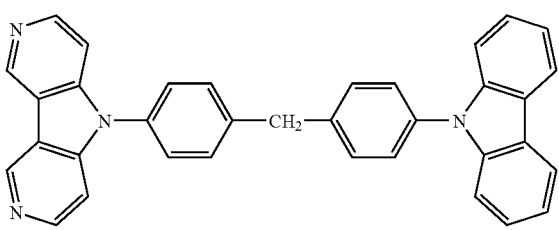
37
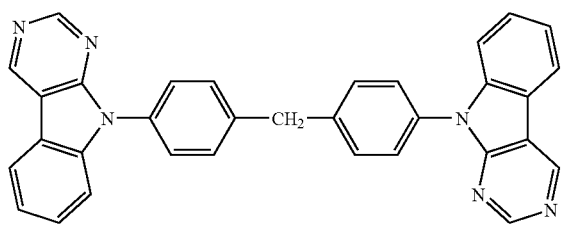
38
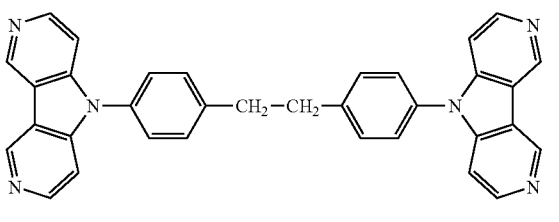
39
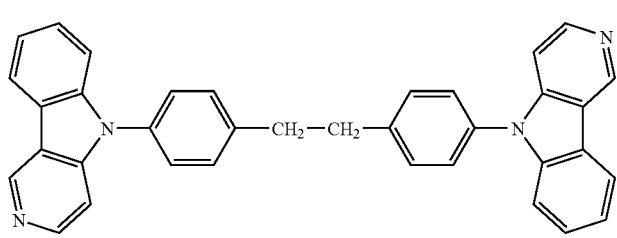
40
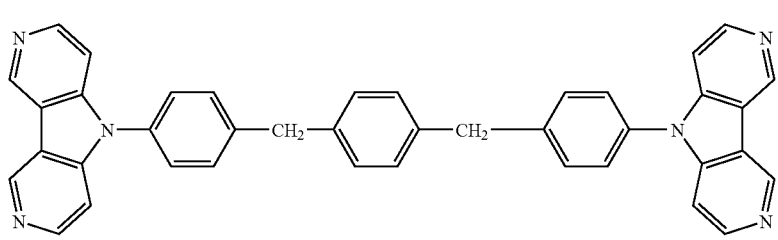
41

-continued
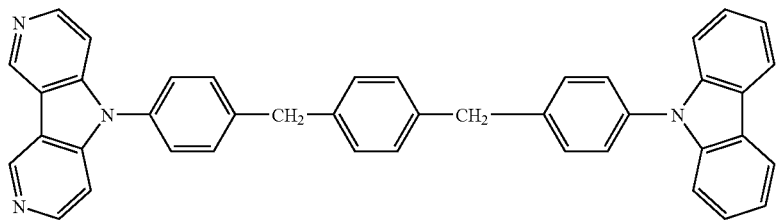
42
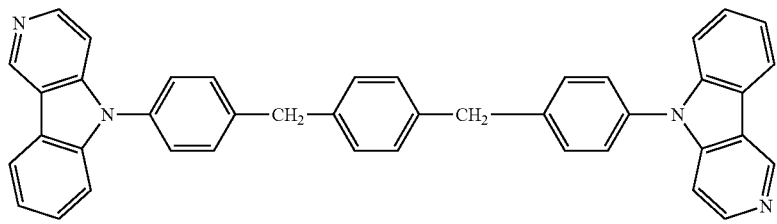
43
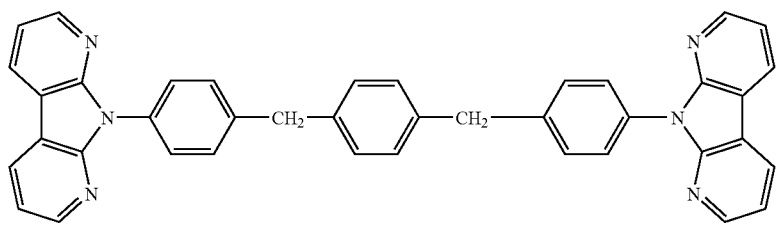
44
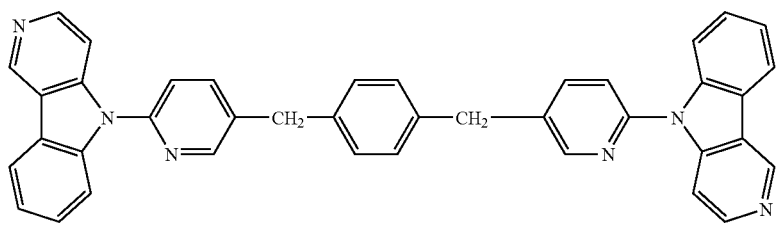
45
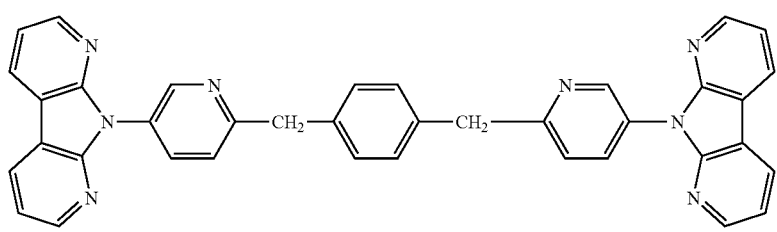
46
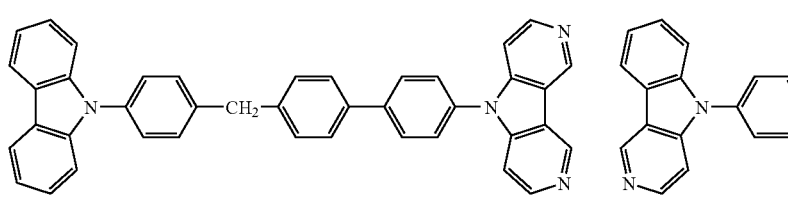
47   48
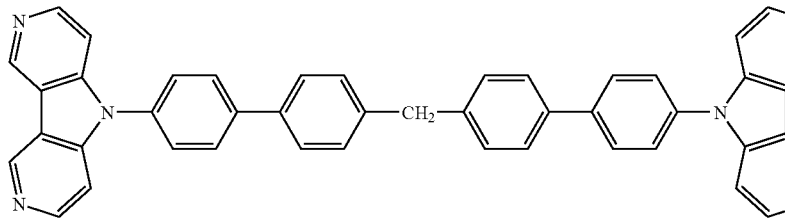
49

50
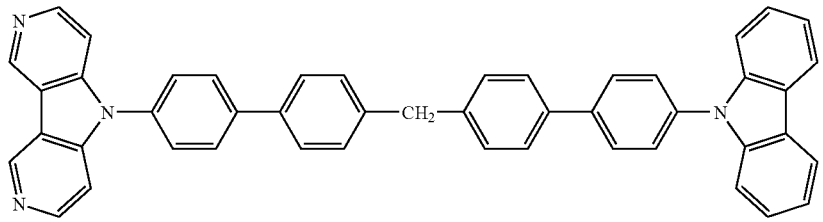
51
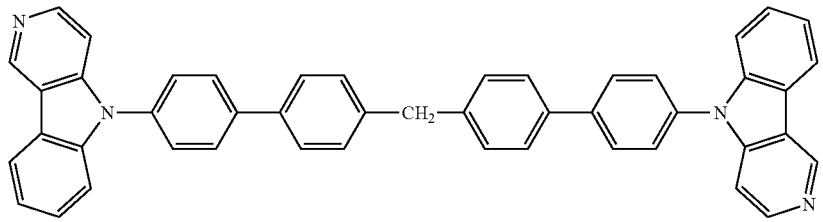
52
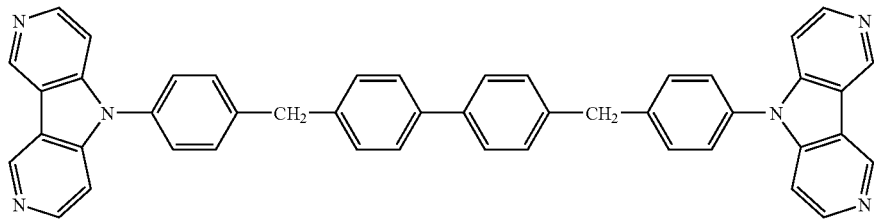
53
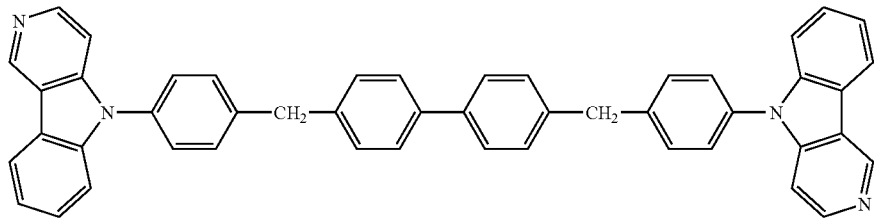
54
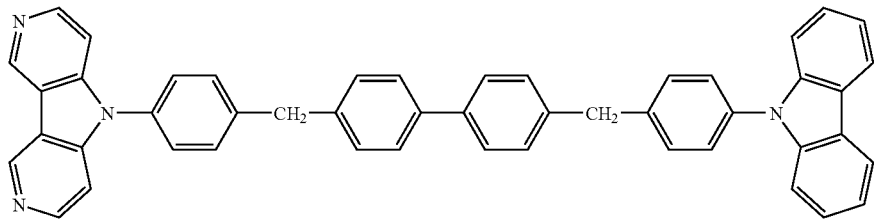
55
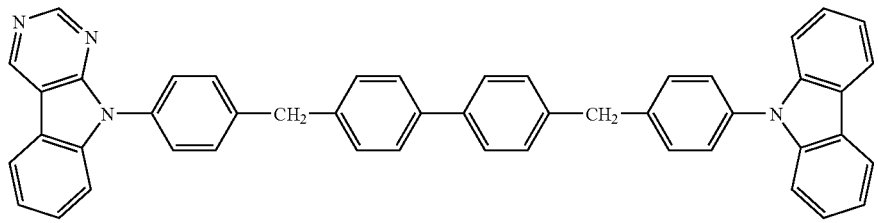
56
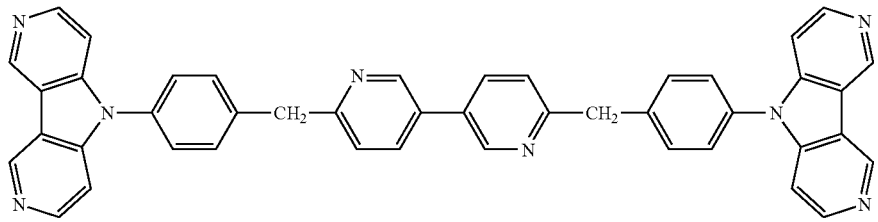

-continued
57
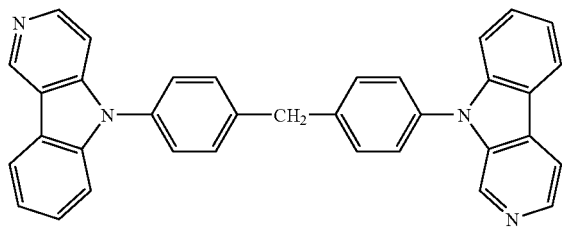
58
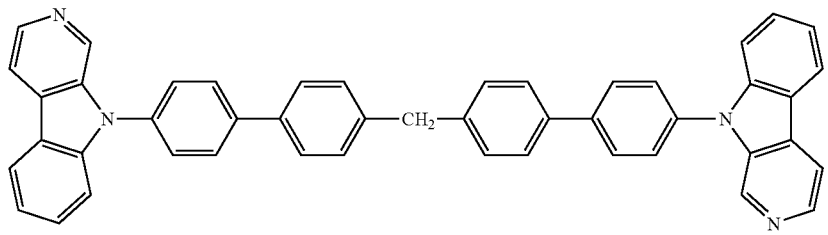
59
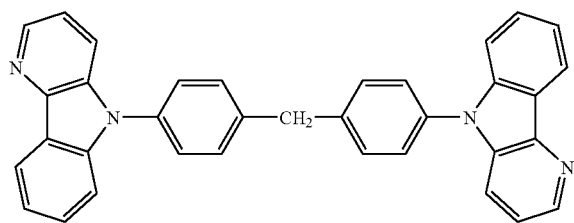
60
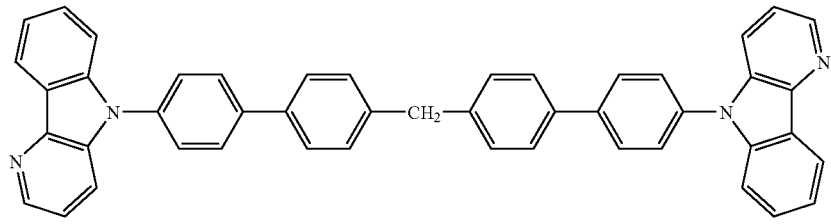
61
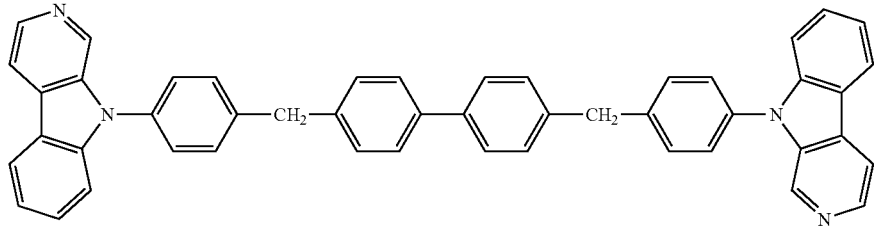
62
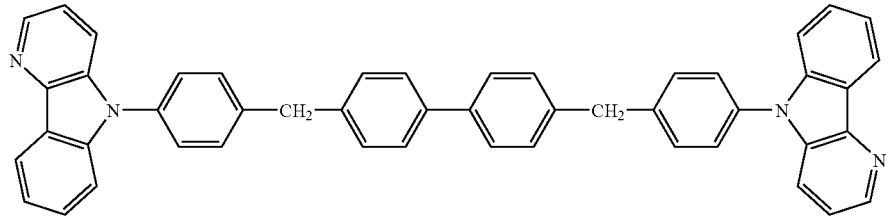
63
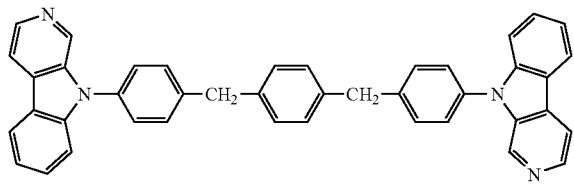
64
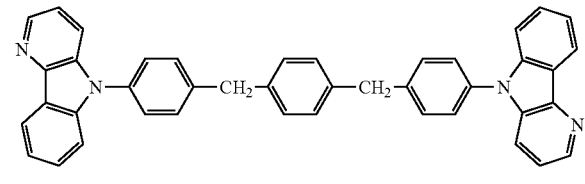

-continued
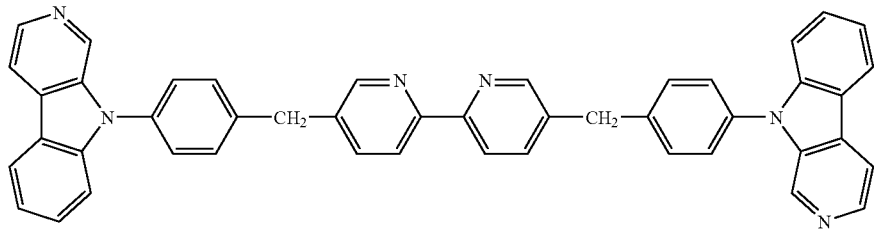
65
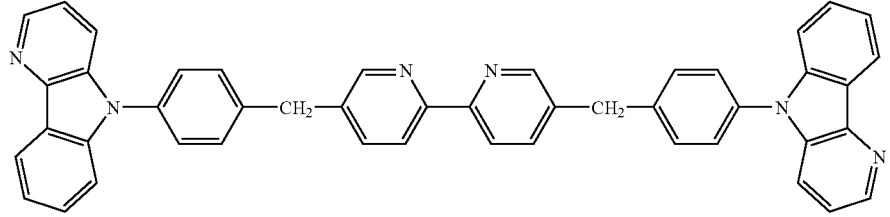
66
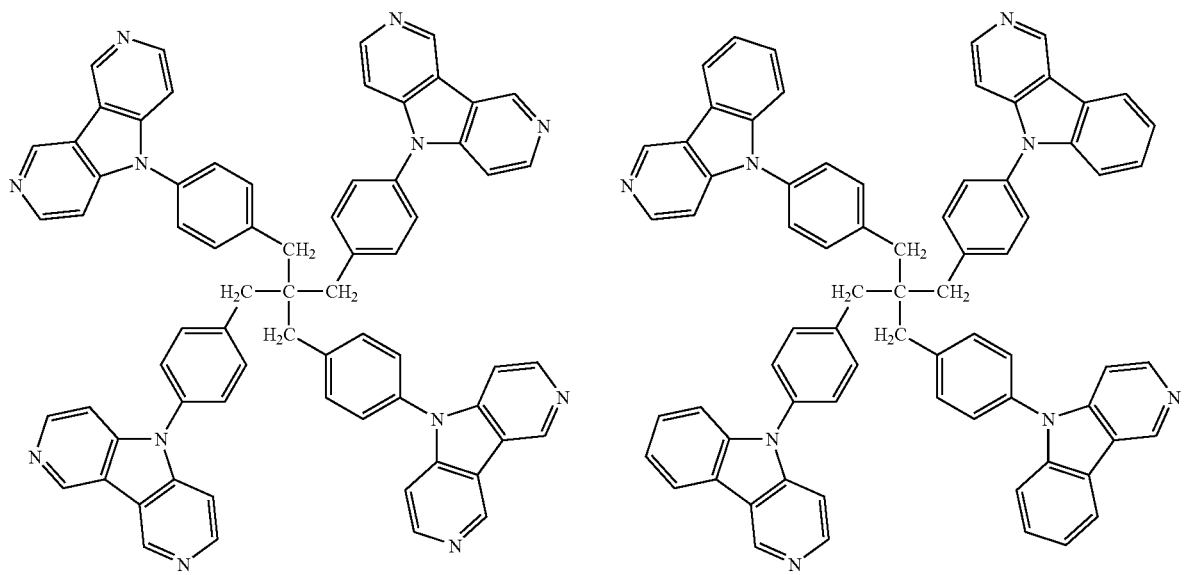
67
68
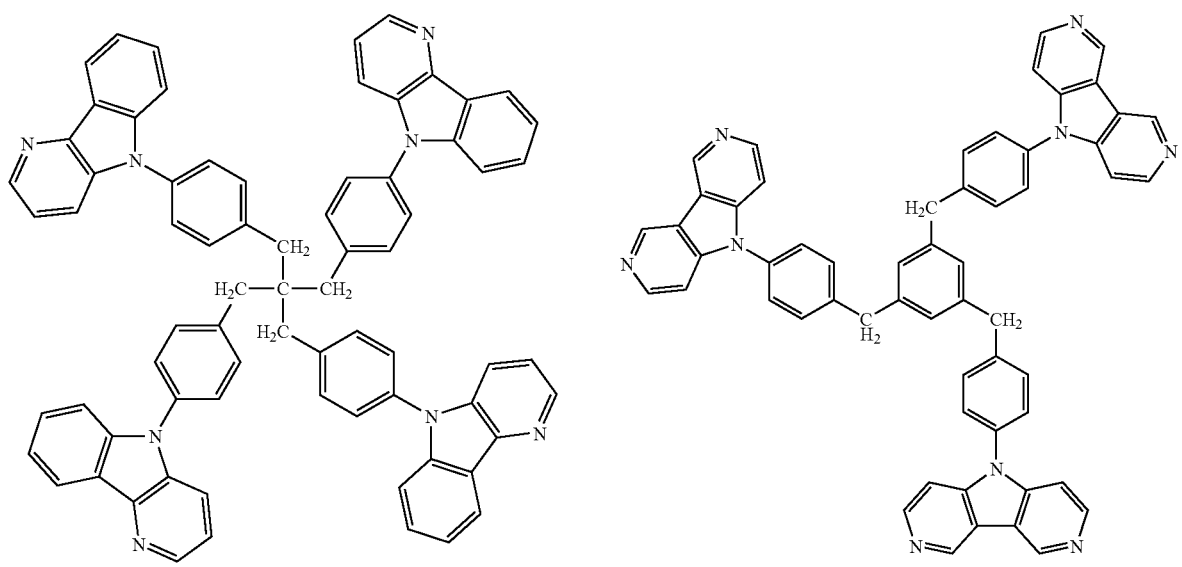
69
70

-continued
71
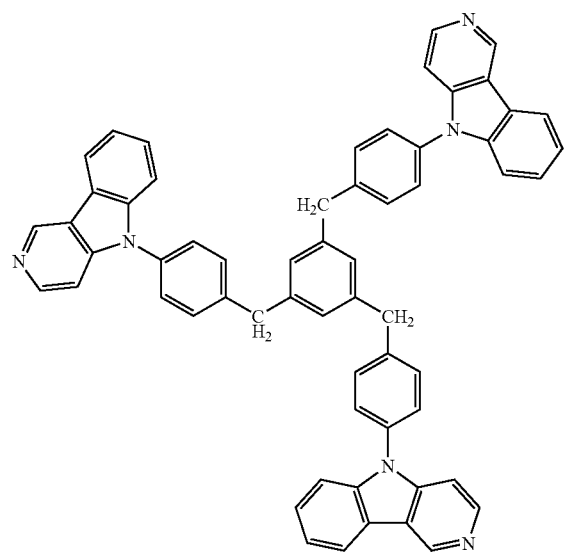
72
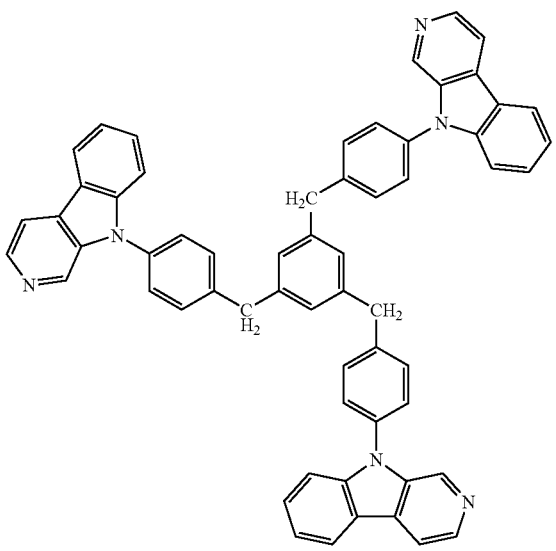
73
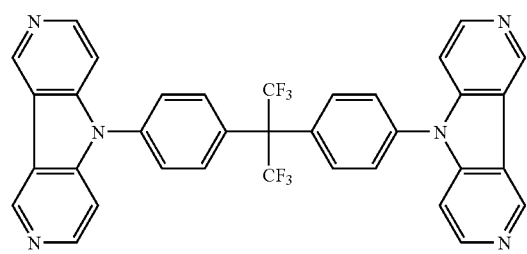
74
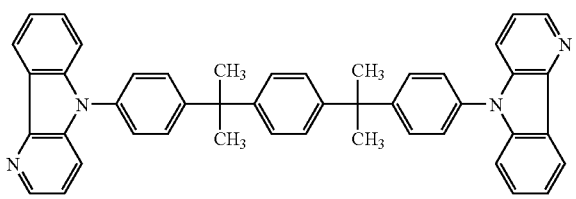
75
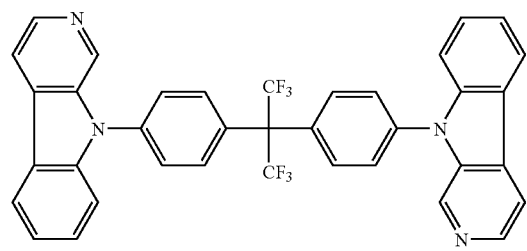
76
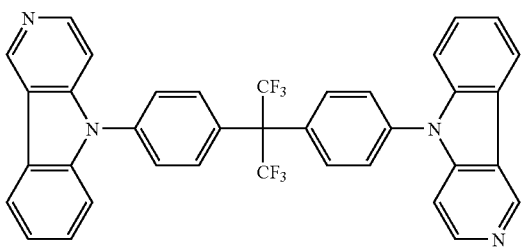
77
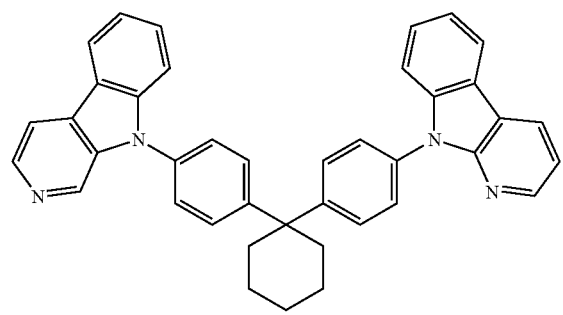
78
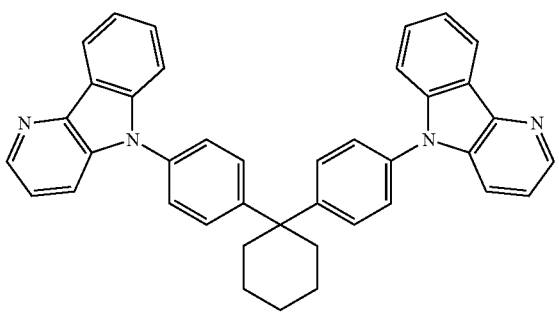

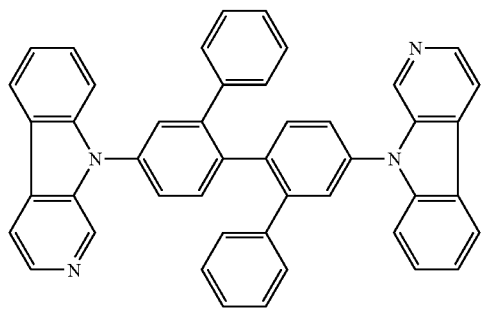

<Electron Inhibition Layer>

On the other hand, an electron inhibition layer is, in a broad meaning, provided with a function of a positive hole transport layer, being comprised of a material having a function of transporting a positive hole but a very small ability of transporting an electron, and can improve the recombination probability of an electron and a positive hole by inhibiting an electron while transporting a positive hole. Further, an arrangement of a positive hole transport layer described later can be appropriately utilized as an electron inhibition layer.

<Positive Hole Transport Layer>

A positive hole transport layer contains a material having a function of transporting a positive hole, and in a broad meaning, a positive hole injection layer and an electron inhibition layer are also included in a positive hole transport layer. A single layer of or plural layers of a positive hole transport layer may be provided.

A positive hole transport material is not specifically limited and can be arbitrary selected from those such as generally utilized as a charge injection transporting material of a positive hole in a conventional photoconductive material and those known in the art and utilized in a positive hole injection layer and a positive hole transport layer of an EL element.

A positive hole transport material is those having any one of a property to inject or transport a positive hole or a barrier property to an electron, and may be either an organic material or an inorganic material. For example, listed are a triazole derivative, an oxadiazole derivative, an imidazole derivative, a polyarylalkane derivative, a pyrazoline derivative, a pyrazolone derivative, a phenylenediamine-derivative, a arylamine derivative, an amino substituted chalcone derivative, an oxazole derivatives, a styrylanthracene derivative, a fluorenone derivative, a hydrazone derivative, a stilbene derivative, a silazane derivative, an aniline type copolymer, or conductive high molecular oligomer, specifically preferably such as thiophene oligomer.

As a positive hole transport material, those described above can be utilized, however, it is preferable to utilized a porphyrin compound, an aromatic tertiary amine compound and a styrylamine compound, and specifically preferably an aromatic tertiary amine compound.

Typical examples of an aromatic tertiary amine compound and a styrylamine compound include N,N,N',N'-tetraphenyl-4,4'-diaminophenyl; N,N'-diphenyl-N,N'-bis(3-methylphenyl)-(1,1'-biphenyl)-4,4'-diamine (TDP); 2,2-bis(4-di-p-tolylaminophenyl)propane; 1,1-bis(4-di-p-tolylaminophenyl)cyclohexane; N,N,N',N'-tetra p-tolyl-4,4'-diaminobiphenyl; 1,1-bis(4-di-p-tolylaminophenyl)-4-phenylcyclohexane; bis(4-dimethylamino-2-methylphenyl) phenylmethane; bis(4-di-p-tolylaminophenyl) phenylmethane; N,N'-diphenyl-N,N'-di(4-methoxyphenyl)-4,4'-diaminobiphenyl; N,N,N',N'-tetraphenyl-4,4'-diaminodiphenylether; 4,4'-bis(diphenylamino)quadriphenyl; N,N,N-tri(p-tolyl)amine; 4-(di-p-tolylamino)-4'-[4-(di-p-tolylamino)styryl]stilbene; 4-N,N-diphenylamino-(2-diphenylvinyl) benzene; 3-methoxy-4'-N,N-diphenylaminostilbene; and N-phenylcarbazole, in addition thereto, those having two condensed aromatic rings in a molecule described in U.S. Pat. No. 5,051,569, such as 4,4'-bis[N-(1-naphthyl)-N-phenylamino]biphenyl (NDP), and 4,4',4''-tris[N-(3-methylphenyl)-N-phenylamino]triphenylamine (MTDATA), in which three of triphenylamine units are bonded in a star burst form, described in JP-A H4-308688.

Polymer materials, in which these materials are introduced in a polymer chain or constitute the main chain of polymer, can be also utilized.

Further, an inorganic compound such as a p type-Si and a p type-SiC can be utilized as a positive hole injection material and a positive hole transport material.

This positive hole transport layer can be provided by forming a thin layer made of the above-described positive hole transport material according to a method known in the art such as a vacuum evaporation method, a spin coating method, a cast method, an inkjet method and a LB method. The layer thickness of a positive hole transport layer is not specifically limited, however, is generally 5-5,000 nm. This positive transport layer may have a single layer structure comprised of one or two or more types of the above described materials.

<Electron Transport Layer>

An electron transfer layer is comprised of a material having a function to transfer an electron, and an electron injection layer and a positive hole inhibition layer are included in an electron transfer layer in a broad meaning. A single layer or plural layers of an electron transfer layer may be provided.

The electron transfer layer is provided with a function to transmit an electron injected from a cathode to an emission layer, and compounds conventionally known in the art can be utilized by arbitrarily selection as a material thereof.

Examples of a material utilized in this electron transfer layer (hereinafter, referred to as an electron transfer material) include such as a nitro-substituted fluorene derivative, a diphenylquinone derivative, a thiopyrandioxide derivative, a heterocyclic tetracarbonic acid anhydride such as naphthaleneperylene, carbodiimide, a fluorenylidenemethane derivative, anthraquinonedimethane and anthrone derivatives, and an oxadiazole derivative, a carboline derivative, or derivative having a carboline ring structure at least one of carbon atom of hydrocarbon ring of which is substituted by nitrogen atom. Further, a thiazole derivative in which an oxygen atom in the oxadiazole ring of the above-described oxadiazole derivative is substituted by a sulfur atom, and a quinoxaline derivative having a quinoxaline ring which is known as an electron attracting group can be utilized as an electron transfer material.

Polymer materials, in which these materials are introduced in a polymer chain or these materials form the main chain of polymer, can be also utilized.

Further, a metal complex of a 8-quinolinol derivative such as tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol) aluminum and bis(8-quinolinol)zinc (Znq); and metal complexes in which a central metal of the aforesaid metal complexes is substituted by In, Mg, Cu, Ca, Sn, Ga or Pb, can be also utilized as an electron transfer material. Further, metal-free or metal phthalocyanine, or those the terminal of which is substituted by an alkyl group and a sulfonic acid group, can be preferably utilized as an electron transfer material. Further, distyrylpyrazine derivative, which has been exemplified as a material of an emission layer, can be also utilized as an electron transfer material, and, similarly to the case of a positive hole injection layer and a positive hole transfer layer, an inorganic semiconductor such as an n-type-Si and an n-type-SiC can be also utilized as an electron transfer material.

This electron transport layer can be provided by forming a thin layer made of the above-described electron transport material according to a method well known in the art such as a vacuum evaporation method, a spin coating method, a cast method, an inkjet method and a LB method. The layer thickness of an electron transport layer is not specifically limited; however, is generally 5-5,000 nm. This electron transport layer may have a single layer structure comprised of one or not less than two types of the above described materials.

An injection layer employed as a component layer of an organic EL element of this invention will be explained.
<Injection Layer>: Electron Injection Layer, Positive Hole Injection Layer An injection layer is provided when it is necessary and includes an electron injection layer and a positive hole injection layer, which way be arranged between an anode and an emission layer or a positive transfer layer, and between a cathode and an emission layer or an electron transfer layer, as described above.

An injection layer is a layer which is arranged between an electrode and an organic layer to decrease an driving voltage and to improve an emission luminance, which is detailed in volume 2, chapter 2 (pp. 123-166) of "Organic EL Elements and Industrialization Front thereof (Nov. 30, 1998, published by N. T. S. Inc.)", and includes a positive hole injection layer (an anode buffer layer) and an electron injection layer (a cathode buffer layer).

An anode buffer layer (a positive hole injection layer) is also detailed in such as JP-A H09-45479, JP-A H09-260062 and JP-A H08-288069, and specific examples include such as a phthalocyanine buffer layer represented by such as copper phthalocyanine, an oxide buffer layer represented by such as vanadium oxide, an amorphous carbon buffer layer, and a polymer buffer layer employing conductive polymer such as polyaniline (emeraldine) and polythiophene.

An electron injection layer (a cathode buffer layer) is also detailed in such as JP-A H06-325871, JP-A H09-17574 and JP-A H10-74583, and specific examples include a metal buffer layer represented by strontium, aluminum and so on, an alkali metal compound buffer layer represented by lithium fluoride, an alkali metal earth compound buffer layer represented by magnesium fluoride and an oxide buffer layer represented by aluminum oxide.

The above-described buffer layer (injection layer) is preferably a very thin layer, and the layer thickness is preferably in a range of 0.1-100 nm although it depends on a raw material.

This injection layer can be prepared by forming a thin layer made of the above-described material according to a method well known in the art such as a vacuum evaporation method, a spin coating method, a cast method, an inkjet method and a LB method. The layer thickness of an injection layer is not specifically limited; however, is generally 5-5,000 nm. This injection layer may have a single layer structure comprised of one or not less than two types of the above described materials.
<Anode>

As an anode according to an organic EL element of this invention, those comprising metal, alloy, a conductive compound, which has a large work function (not less than 4 eV), and a mixture thereof as an electrode substance are preferably utilized. Specific examples of such an electrode substance include a conductive transparent material such as metal like Au, CuI, indium tin oxide (ITO), $SnO_2$ and ZnO. Further, a material such as IDIXO ($In_2O_3$—ZnO), which can prepare an amorphous and transparent electrode, may be also utilized. As for an anode, these electrode substances may be made into a thin layer by a method such as evaporation or spattering and a pattern of a desired form may be formed by means of photolithography, or in the case of requirement of pattern precision is not so severe (not less than 100 μm), a pattern may be formed through a mask of a desired form at the time of evaporation or spattering of the above-described substance. When emission is taken out of this anode, the transmittance is preferably set to not less than 10% and the sheet resistance as an anode is preferably not more than a several hundreds Ω/□. Further, although the layer thickness depends on a material, it is generally selected in a range of 10-1,000 nm and preferably of 10-200 nm.
<Cathode>

On the other hand, as a cathode according to this invention, metal, alloy, a conductive compound and a mixture thereof, which have a small work function (not more than 4 eV), are utilized as an electrode substance. Specific examples of such an electrode substance includes such as sodium, sodium-potassium alloy, magnesium, lithium, a magnesium/copper mixture, a magnesium/Silver mixture, a magnesium/aluminum mixture, a magnesium/indium mixture, an aluminum/aluminum oxide ($Al_2O_3$) mixture, indium, a lithium/aluminum mixture and rare earth metal. Among them, with respect to an electron injection property and durability against such as oxidation, preferable are a mixture of electron injecting metal with the second metal which is stable metal having a work function larger than electron injecting metal, such as a magnesium/silver mixture, a magnesium/aluminum mixture, a magnesium/indium mixture, an aluminum/aluminum oxide ($Al_2O_3$) mixture and a lithium/aluminum mixture, and aluminum. A cathode can be provided by a method such as evaporation or spattering to form a thin layer. Further, the sheet resistance as a cathode is preferably not more than a several hundreds Ω/□ and the layer thickness is generally selected in a range of 10-1,000 nm and preferably of 50-200 nm. Herein, to transmit emission, either one of an anode or a cathode of an organic EL element is preferably transparent or translucent to improve the mission luminance.
<Substrate (Also Referred to as Base Plate, Base Material or Support)>

A substrate according to an organic EL element of this invention is not specifically limited with respect to types of such as glass and plastics provided being transparent, however, a substrate preferably utilized includes such as glass, quartz and transparent resin film. A specifically preferable substrate is resin film capable of providing an organic EL element with a flexible property.

Resin film includes such as film comprised of polyethylene terephthalate (PET), polyethylene naphthalate (PEN), polyether sulfone (PES), polyether imide, polyether etherketone, polyphenylene sulfide, polyallylate, polyimide, polycarbonate (PC), cellulose triacetate (TAC) and cellulose acetate propionate (CAP).

On the surface of resin film, an inorganic or organic cover layer or a hybrid cover layer comprising the both may be formed, and the film is preferably provided with a high barrier ability having a vapor transmittance of not more than 0.01 $g/m^2 \cdot day \cdot atm$.

The taking out efficiency of emission of an organic EL element of this invention at room temperature is preferably not less than 1% and more preferably not less than 2%. Herein, taking out quantum efficiency (%)=photon number emitted out of organic RL element/electron number flown into organic EL element×100.

Further, a hue improving filter such as a color filter may be utilized in combination.

In the case of an illumination application, roughening processed film (such as anti-glare film) can be also utilized in combination to decrease emission unevenness.

In the case of an application as a multi-color display device, the display is comprised of at least two types of organic EL elements having different emission maximum wavelengths, and a preferable example to prepare an organic EL element will now be described.

<Preparation Method of Organic EL Element>

As an example of a preparation method of an organic EL element of this invention, a preparation method of an organic EL element, comprising anode/positive hole injection layer/positive hole transport layer/emission layer/positive hole inhibition layer/electron transport layer/cathode buffer layer/cathode, will be described.

First, on an appropriate substrate, a thin layer comprising a desired electrode substance such as an anode electrode substance is formed by means of evaporation or spattering so as to make a layer thickness of not more than 1 μm and preferably of 10-200 mm, whereby an anode is prepared. Next, on this layer, thin layers containing organic substances of such as a positive hole injection layer, a positive hole transport layer, an emission layer, a positive hole inhibition layer and an electron transport layer are formed.

A thin layer forming method of these layers containing the organic substances includes such as a spin coat method, a cast method, an inkjet method, an evaporation method and a printing method as described before, however, a vacuum evaporation method or a spin coat method is specifically preferable with respect to easy preparation of a homogeneous layer and bare generation of pinholes. Further, a different layer forming method depending on each layer may be applied. In the case of employing an evaporation method in layer formation, the evaporation condition depends on such as the type of a utilized compound, however, is generally appropriately selected in a range of 50-450° C. as a boat heating temperature, $10^{-6}$-$10^{-2}$ Pa as a vacuum degree, 0.01-50 nm/sec as a deposition rate, −50-300° C. as a substrate temperature and 1 nm-5 μm as a layer thickness.

After formation of these layers, a thin layer comprising a cathode electrode substance is formed thereon by means of such as evaporation or spattering so as to make a layer thickness in a range of 50-200 nm to provide a cathode, whereby a desired organic EL element can be prepared. This preparation of an organic EL element is preferably carried out with one time evacuation to prepare all through from a positive hole injection layer to a cathode, however, different layer forming method may be also applied by taking out the element on the way. At that time, consideration is necessary such as to perform the operation under a dry inert gas environment.

<Display Device>

A display device of this invention will now be described.

A display device of this invention may be either monochromatic or multi-colored. Here described will be a multicolor display device. In the case of a multicolor display device, a shadow mask is provided only at the time of emission layer formation, and layers can be formed all over the surface by such as an evaporation method, a cast method, a spin coat method, an inkjet method and a printing method.

When patterning is performed only with an emission layer, the method is not specifically limited; however, preferable are an evaporation method, an inkjet method and a printing method. And patterning employing a shadow mask is preferred in the case of an evaporation method.

Further, reversing the preparation order, it is also possible to prepare layers in the order of a cathode, an electron transport layer, a positive hole inhibition layer, an emission layer, a positive hole transport layer and an anode.

When a direct current voltage is applied on the multicolor display device thus prepared, emission can be observed by application of a voltage of approximately 2-40 V setting an anode to + (plus) polarity and a cathode to − (minus) polarity. Further, no current flows and no emission generate at all even when a voltage is applied with a reversed polarity. Further, in the case of alternate current voltage being applied, emission generates only in a state of an anode being + and a cathode being −. Herein, the wave shape of alternate current may be arbitrary.

A multicolor display device can be utilized as a display device, a display and various types of emission light sources. In a display device and a display, full-colored display is possible by employing three types of organic EL elements providing blue, red and green emissions.

A display device and a display include a TV, a personal computer, a mobile instrument, an AV instrument, a character broadcast display and an information display in a car. Particularly, the display device and the display may be also utilized as a display to playback still images and moving images, and may adapt either a simple matrix (a passive matrix) mode or an active matrix mode when being utilized as a display device for moving image playback.

An illumination light source includes a home use illumination, a car room illumination, a backlight of a watch or a liquid crystal, a panel advertisement, a signal, a light source of an optical memory medium, a light source for an electrophotographic copier, a light source for an optical telecommunication processor and a light source for a photo-sensor, however, is not limited thereto.

<Illumination Device>

Illumination device of this invention will now be described. The illumination device of this invention comprises the organic EL element mentioned above.

An organic EL element of this invention can be utilized as an organic EL element provided with a resonator structure, and a utilization purpose of such an organic EL element provided with a resonator structure includes such as a light source for an optical memory medium, a light source for an electrophotographic copier, a light source for a optical telecommunication processor and a light source for a photo-sensor, however, is not limited thereto. Further, the organic EL element may be utilized for the above-described applications by being made to perform laser emission.

Further, an organic EL element of this invention may be utilized as one type of a lamp like an illumination and an exposure light, and may be also utilized as a display device of a projector of an image projecting type and a display device (a display) of a type to directly view still images and moving images. An operating mode in the case of being utilized as a display device for playback of moving images may be either a simple matrix (a passive matrix) mode or an active matrix mode. In addition, a full-color display device can be prepared by utilizing at least two types of organic EL elements of this invention which emit different emitting colors.

In the following, one example of a display device provided with an organic EL element of this invention will be described.

FIG. 1 is a schematic drawing to show an example of a display device constituted of an organic EL element. It is a schematic drawing of a display, which displays image information by emission of an organic EL element, such as a mobile phone.

Display 1 is constituted of such as display section A having plural number of pixels and control section B which performs image scanning of display section A based on image information.

Control section B, which is electrically connected to display section A, sends a scanning signal and an image data signal to plural number of pixels based on image information from the outside and pixels of each scanning line successively emit depending on the image data signal by a scanning signal to perform image scanning, whereby image information is displayed on display section A.

Figure 2:
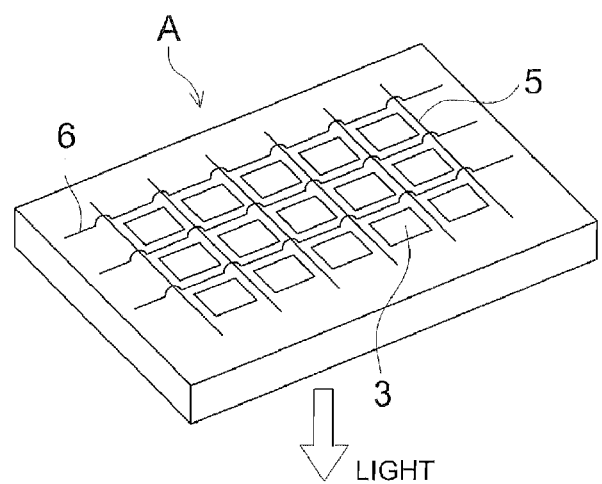
FIG. 2 is a schematic drawing of a display portion

FIG. 2 is a schematic drawing of display section A.

Display section A is provided with such as a wiring part, which contains plural scanning lines 5 and data lines 6, and plural pixels 3 on a substrate. Primary part materials of display section A will be explained in the following.

In the drawing, shown is the case that light emitted by pixel 3 is taken out along the white allow (downward).

Scanning lines 5 and plural data lines 5 in a wiring part each are comprised of a conductive material, and scanning lines 5 and data lines 6 are perpendicular in a grid form and are connected to pixels 3 at the right-angled crossing points (details are not shown in the drawing).

Pixel 3 receives an image data from data line 6 when a scanning signal is applied from scanning line 5 and emits according to the received image data. Full-color display device is possible by appropriately arranging pixels having an emission color in a red region, pixels in a green region and pixels in a blue region, side by side on the same substrate.

Figure 3:
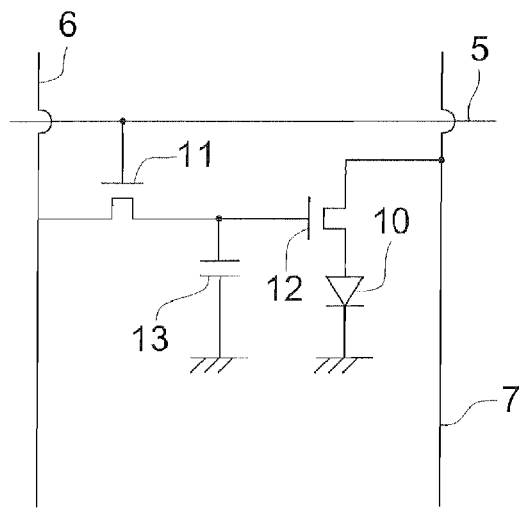
FIG. 3 is a schematic drawing of a pixel.

Next an emission process of a pixel will be described,
FIG. 3 is a schematic view of a pixel.

A pixel is equipped with such as organic EL element 10, switching transistor 11, driving transistor 12 and condenser 13. Red, green and blue emitting organic EL elements are utilized as organic EL element 10 for plural pixels, and full-color display device is possible by arranging these side by side on the same substrate.

In FIG. 3, an image data signal is applied on the drain of switching transistor 11 via data line 6 from control section B. Then, when a scanning signal is applied on the gate of switching transistor 11 via scanning line 5 from control section B, operation of switching transistor is on to transmit the image data signal applied on the drain to the gates of condenser 13 and driving transistor 12.

Driving transistor 12 is on, simultaneously with condenser 13 being charged depending on the potential of an image data signal, by transmission or an image data signal. In driving transistor 12, the drain is connected to electric source line 7 and the source is connected to the electrode of organic EL element 10, and an electric current is supplied from electric source line 7 to organic EL element 10 depending on the potential of an image data applied on the gate.

When a scanning signal is transferred to next scanning line 5 by successive scanning of control section B, operation of switching transistor 11 is off. However, since condenser 13 keeps the charged potential of an image data signal even when operation of switching transistor 11 is off, operation of driving transistor 12 is kept on to continue emission of organic EL element 10 until the next scanning signal is applied. When the next scanning signal is applied by successive scanning, driving transistor 12 operates depending on the potential of an image data signal synchronized to the scanning signal and organic EL element 10 emits.

That is, emission of each organic EL element 10 of plural pixels 3 is performed by providing switching transistor 11 and driving transistor 12 against each organic EL element 10 of plural pixels 3. Such an emmission method is called as an active matrix mode.

Herein, emission of organic EL element 10 may be either emission of plural gradations based on a multiple-valued image data signal having plural number of gradation potentials or on and off of a predetermined emission quantity based on a binary image data signal.

Further, potential hold of condenser 13 may be either continuously maintained until the next scanning signal application or discharged immediately before the next scanning signal application.

Emission operation is not necessarily limited to the above-described active matrix mode but may be a passive matrix mode in which organic EL element is emitted based on a data signal only when a scanning signal is scanned in this invention.

Figure 4:
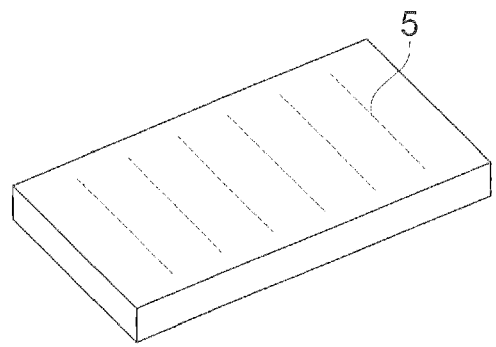
FIG. 4 is a schematic drawing of a passive matrix type full color display.
Figure 4:
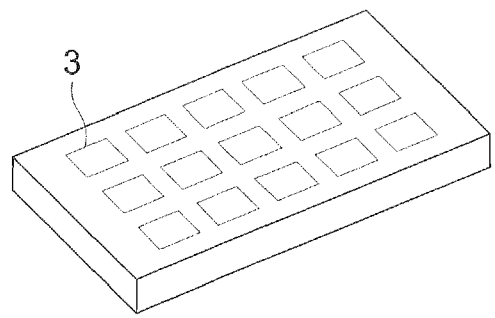
Figure 4:
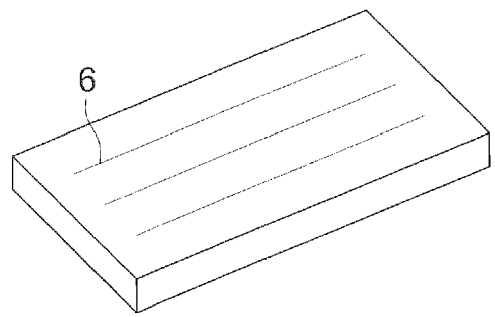

FIG. 4 is a schematic drawing of a display device based on a passive matrix mode. In FIG. 4, plural number of scanning lines 5 and plural number of image data lines 6 are arranged grid-wise, opposing to each other and sandwiching pixels 3.

When a scanning signal of scanning line 5 is applied by successive scanning, pixel 3 connected to scanning line 5 applied with said signal emits depending on an image data signal.

Decrease of manufacturing cost is possible since pixel 3 is provided with no active element in a passive matrix mode.

An organic EL, element material of this invention can be also applied to an organic EL element to generate emission of practically white color as an illumination device. Plural emission colors are simultaneously emitted by plural number of emission materials to obtain white light by mixing colors. A combination of plural emission colors may be either the one, in which three emission maximum wavelengths of three primary colors of blue, green and red are contained, or the other, in which two emission maximum wavelengths, utilizing a relationship of complimentary colors such as blue and yellow, or blue and orange, are contained.

Further, a combination of emission materials to obtain plural number of emission colors may be either a combination comprising plural number of materials which emit phosphoresce or fluorescence, or a combination of a material which emits phosphoresce or fluorescence and a dye material which emits by light from an emission material as exiting light, however, in a white organic electroluminescence element according to this invention, it is enough only to mix plural emission dopants in combination. A mask is provided only at the time of forming such as an emission layer, a positive hole transport layer or an electron transport layer, to only simply arrange the plural emission dopants such as by separately painting through the mask, while other layers are commonly utilized to require no patterning such as a mask. Therefore, such as an electrode can be formed all over the plane by such as an evaporation method, a cast method, a spin coat method, an inkjet method and a printing method, resulting in improvement of productivity. According to this method, different from a white organic EL device in which plural colors of emission elements are arranged parallel in an alley form, an element itself is white emitting.

An emission material utilized in an emission layer is not specifically limited, and in the case of a backlight of a liquid crystal display element, any combination by arbitrary selection among platinum complexes according to this invention or emission materials known in the art can be utilized so as to be fitted to the wavelength range corresponding to CF (color filter) characteristics, whereby white emission can be obtained.

In such manner, a white emitting organic EL element of this invention is usefully utilized as one type of a lamp such as a home use illumination, a car room illumination or an exposure light source as various emission light sources or illumination devices, in addition to the aforesaid display device and a display, and is further usefully applied for a display as such as a backlight of a liquid crystal display.

In addition to these, listed is a wide range of applications such as a backlight of a watch and so on, a light source of an advertising board, a signal, an optical memory medium, a light source of an electrophotographic copier, a light source of an optical telecommunication processor and a light source of an optical sensor, and further general home use electric instruments which require a display device.

EXAMPLES

The Invention is described below referring Examples though the invention is not limited to the examples. The compounds used in the examples are listed below.

Comparative 1
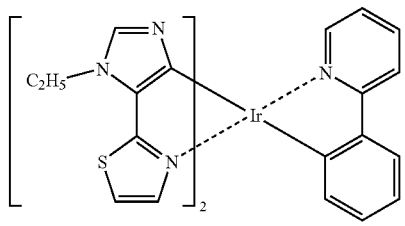

Comparative 2
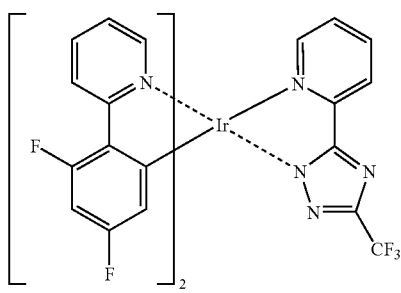

-continued

Comparative 3
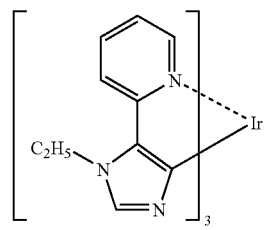

Comparative 4
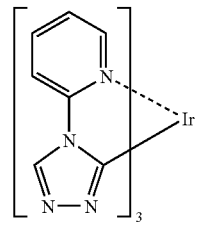

H-1
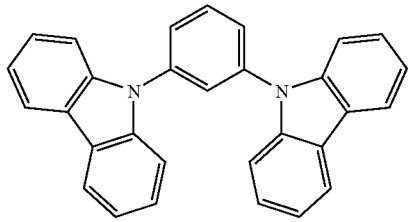

H-2
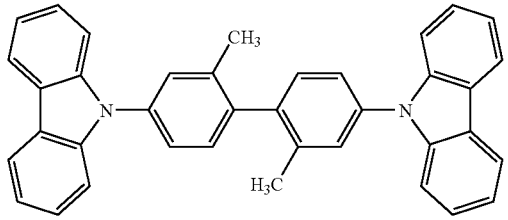

CBP
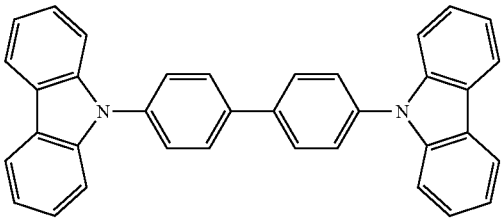

E-1
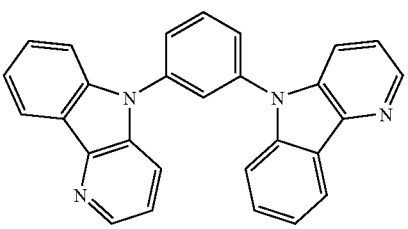

E-2
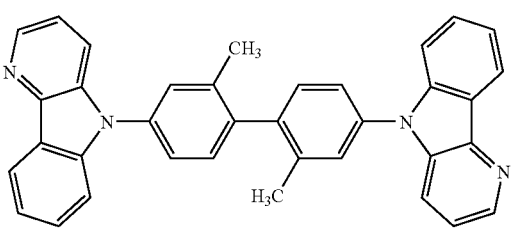

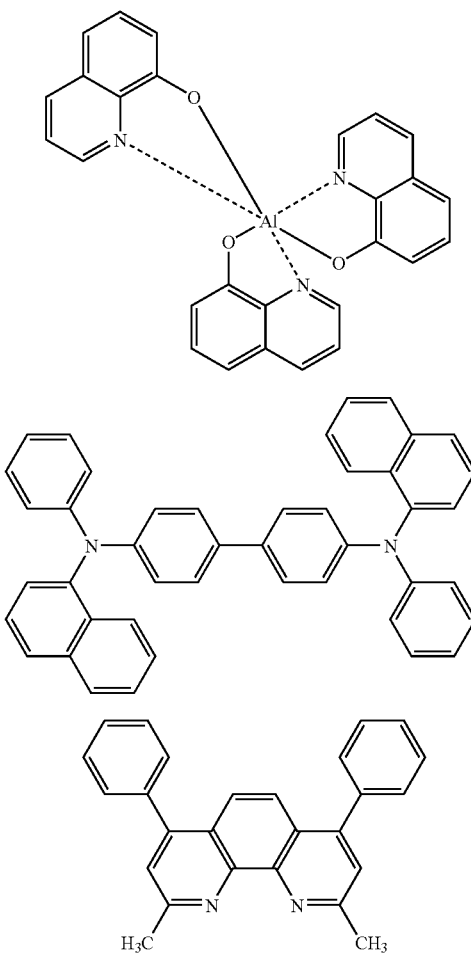

Example 1

Preparation of Organic EL Device 1-1

A glass plate on which a layer of 150 nm of ITO as an anode (NA-45 manufactured by NH Techno Glass Corps) was subjected to patterning. Thus obtained transparent substrate having the anode was washed by iso-propyl alcohol while applying ultrasonic waves, dried by dried nitrogen gas and subjected to UV ozone washing for 5 minutes. The resultant transparent substrate plate was fixed on the substrate holder of a vacuum evaporating deposition apparatus available on the market. Besides, five tantalum resistive heating boats were provided in the vacuum evaporating deposition apparatus (the first vacuum chamber). In each of boats, α-NPD, CBP, Ir-12, BC and Alq$_3$ were each charged, respectively.

Moreover, lithium fluoride and aluminum were each charged in a tantalum resistive heating boat and a tungsten resistive heating boat, respectively, and the boats were provided in the second vacuum chamber of the vacuum evaporating deposition apparatus.

The pressure in the first vacuum chamber was reduced by $4 \times 10^{-4}$ Pa and then the heating boat containing α-NPD was heated by applying electric current for evaporation depositing α-NPD on the transparent substrate plate in a deposition rate of from 0.1 nm/sec to 0.2 nm/sec to form a positive hale injection/transfer layer having a thickness of 90 nm.

After that, electric current was independently applied to the heating boat containing CBP and that containing Ir-12 while controlling the current so that the ratio of the deposition rate of CPB as the light emission host to that of Ir-12 as the light emission dopant was made to 100:6 to form a light emission layer having a thickness of 30 nm.

Then the heating boat containing BC was heated by applying electric current to provide a positive hole blocking layer having a thickness of 10 nm at a deposition rate of from 0.1 nm/sec to 0.2 nm/sec.

Moreover, the heating boat containing Alq$_3$ was heated by applying electric current to provide an electron transfer layer having a thickness of 20 nm at a deposition rate of from 0.1 nm/sec to 0.2 nm/sec.

The device on which the layers until the electron transfer layer were formed was transferred to the second vacuum chamber while holding the vacuum, and then a rectangular stainless steel mask having a hole was positioned on the electron transfer layer by remote control from outside.

The pressured in the second vacuum chamber was reduced by $2 \times 10^{-4}$ Pa, and electric current was applied to the heating boat containing lithium fluoride to provide a cathode buffer layer having a thickness of 0.5 nm at a deposition rate of from 0.01 nm/sec to 0.02 nm/sec and then electric current was applied to the boat containing aluminum to form a cathode having a thickness of 150 nm at a deposition rate of from 1 nm/sec to 2 nm/sec.

Figure 5:
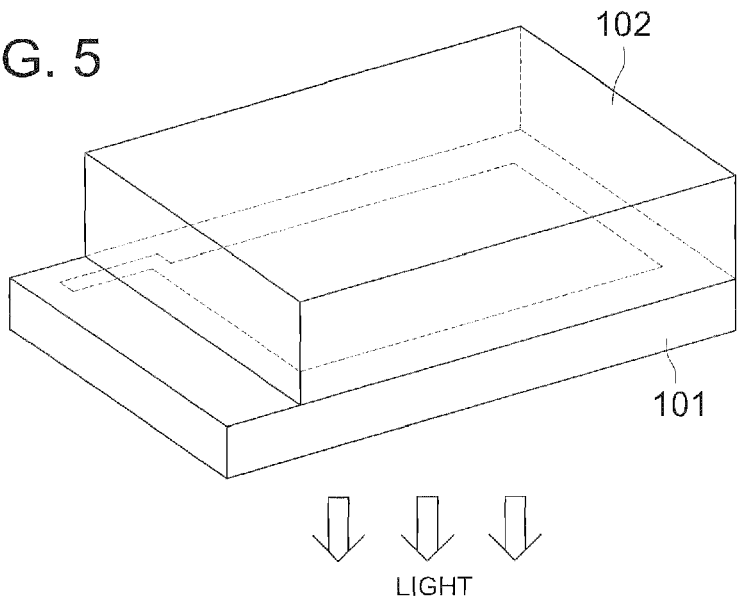
FIG. 5 is a schematic drawing of an illumination device.
Figure 6:
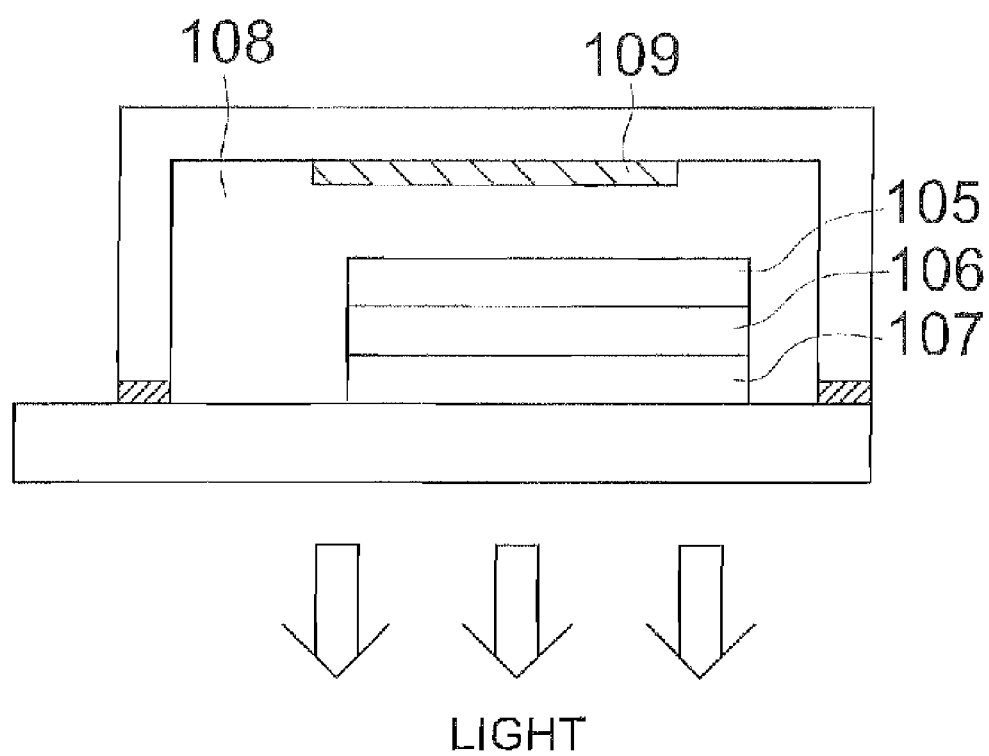
FIG. 6 is a cross section of the illumination device.

The non-light emission side of each of thus prepared EL devices was covered by a glass case, and a glass plate having a thickness of 300 μm was used as sealing substrate, on circumference of which Luxtrack LC0629B, manufactured by Toagosei Co., Ltd., was applied as a sealing agent, and contacted with the transparent substrate so as to overlap with the cathode, and sealed by curing the sealing agent by irradiation of UV rays to prepare the illuminating device shown in FIGS. 5 and 6. Thus obtained illuminating device was subjected to evaluation.

FIG. 5 shows a schematic drawing of the illumination device in which the organic EL device 101 is covered by a glass cover 102. The sealing by the glass cover was carried out under a nitrogen atmosphere in a globe box filled by an atmosphere of highly purified nitrogen atmosphere of not less than 99.999% so that the organic EL device 101 is not contact with air. In FIG. 6, 105 is the cathode, 106 is the organic EL layer and 107 is the glass substrate having the transparent electrode. In the glass cover 102, nitrogen gas is charged and a moisture capturing agent 109 is enclosed.

<<Preparation of Organic EL Device 1-2 to 1-18>>

Organic EL Devices 1-2 to 1-18 were prepared in the same manner as in Organic EL device 1-1 except that the light emission host, the light emission dopant and the positive hole blocking agent were changed as shown in Table 1.

<<Evaluation of Organic EL Device>>

Thus obtained Organic EL devices 1-1 to 1-18 were evaluated as follows.

(Externally Taking Out Quantum Efficiency)

Each of the organic EL devices was driven under a steady electric current condition of 2.5 mA/cm$^2$ at room temperature (about 23 to 25° C.), and the luminance (L) [cd/m$^2$] just after beginning of lighting was measured and the externally taking out quantum efficiency (η) was calculated. The measurement of the luminance was carried out by CS-1000, manufactured by Minolta was used. The externally taking out quantum efficiency was represented by relative value when that of Organic EL Device 1-1 was set at 100.

(Light Emission Lifetime)

The organic EL element was continuously driven with the constant electric current condition of 2.5 mA/cm² and time until the luminance was reduced by ½($\tau_{1/2}$) was measured. The light emission lifetime was represented by relative value when that of Organic EL device 1-1 was set at 100.

Thus obtained results are listed in Table 1.

TABLE 1

| Organic EL device No. | Light emission host | Light emission dopant | Positive hole blocking layer | Externally taking out quantum efficiency | Light emission lifetime ($\tau_{1/2}$) | Remarks |
|---|---|---|---|---|---|---|
| 1-1 | CBP | Ir-12 | BC | 100 | 100 | Comp. |
| 1-2 | CBP | Comp. 1 | BC | 98 | 200 | Comp. |
| 1-3 | CBP | Comp. 2 | BC | 102 | 250 | Comp. |
| 1-4 | CBP | Comp. 3 | BC | 110 | 350 | Comp. |
| 1-5 | CBP | Comp. 4 | BC | 107 | 380 | Comp. |
| 1-6 | CBP | 1-5 | BC | 132 | 810 | Inv. |
| 1-7 | CBP | 1-6 | BC | 131 | 790 | Inv. |
| 1-8 | CBP | 1-9 | BC | 133 | 820 | Inv. |
| 1-9 | CBP | 1-11 | BC | 131 | 850 | Inv. |
| 1-10 | H-1 | 1-15 | BC | 127 | 770 | Inv. |
| 1-11 | CBP | 1-17 | BC | 125 | 750 | Inv. |
| 1-12 | CBP | 1-19 | BC | 129 | 640 | Inv. |
| 1-13 | H-2 | 1-19 | E-1 | 132 | 840 | Inv. |
| 1-14 | CBP | 1-20 | BC | 130 | 630 | Inv. |
| 1-15 | CBP | 1-20 | E-2 | 129 | 780 | Inv. |
| 1-16 | CBP | 1-25 | E-2 | 126 | 860 | Inv. |
| 1-17 | CBP | 1-27 | E-2 | 135 | 730 | Inv. |
| 1-18 | CBP | 1-28 | E-2 | 122 | 690 | Inv. |

Comp.: Comparative, Inv.: Inventive

It is cleared from Table 1 that the higher light emission efficiency and longer light emission lifetime can be attained in the organic EL devices prepared by using the metal complex relating to the invention compared with the comparative organic EL devices.

Example 2

Preparation of Organic EL Device 2-1

A glass plate on which a layer of 150 nm of ITO as an anode (NA-45 manufactured by NH Techno Glass Corp.) was subjected to patterning. Thus obtained transparent substrate having the anode was washed by iso-propyl alcohol while applying ultrasonic waves, dried by dried nitrogen gas and subjected to UV ozone washing for 5 minutes. The resultant transparent substrate plate was fixed on the substrate holder of a vacuum evaporating deposition apparatus available on the market. Besides, five tantalum resistive heating boats were provided in the vacuum evaporating deposition apparatus (the first vacuum chamber). In each of boats, α-NPD, CBP, Ir-12, BC and Alq₃ were each charged, respectively.

Moreover, lithium fluoride and aluminum were each charged in a tantalum resistive heating boat and a tungsten resistive heating boat, respectively, and the boats were provided in the second vacuum chamber of the vacuum evaporating deposition apparatus.

The pressure in the first vacuum chamber was reduced by $4 \times 10^{-4}$ Pa and then the heating boat containing α-NPD was heated by applying electric current for evaporation depositing α-NPD on the transparent substrate plate in a deposition rate of from 0.1 nm/sec to 0.2 nm/sec to form a positive hole injection/transfer layer having a thickness of 40 nm.

After that, electric current was independently applied to the heating boat containing CBP and that containing Ir-12 while controlling the current so that the ratio of the deposition rate of CBP as the light emission host to that of Ir-12 as the light emission dopant was made to 100:6 to form a light emission layer having a thickness of 40 nm.

Then the heating boat containing BC was heated by applying electric current to provide a positive hole blocking layer having a thickness of 10 nm at a deposition rate of from 0.1 nm/sec to 0.2 nm/sec. Moreover, the heating boat containing Alq₃ was heated by applying electric current to provide an electron transfer layer having a thickness of 20 nm at a deposition rate of from 0.1 nm/sec to 0.2 nm/sec.

The device on which the layers until the electron transfer layer were formed was transferred to the second vacuum chamber while holding the vacuum, and then a rectangular stainless steel mask having a hole was positioned on the electron transfer layer by remote control from outside.

The pressured in the second vacuum chamber was reduced by $2 \times 10^{-4}$ Pa, and electric current was applied to the heating boat containing lithium fluoride to provide a cathode buffer layer having a thickness of 0.5 nm at a deposition rate of from 0.01 nm/sec to 0.02 nm/sec and then electric current was applied to the boat containing aluminum to form a cathode having a thickness of 150 nm at a deposition rate of from 1 nm/sec to 2 nm/sec. The device was transferred into the nitrogen gas atmosphere in the glove box in which the atmosphere was replaced by highly purified nitrogen gas of not less than 99.999% without contact to air and sealed in the same manner as in Organic EL Device 1-1 to prepare Organic EL Device 2-1.

<<Preparation of Organic EL Device 2-2 to 2-16>>

Organic EL Devices 2-2 to 2-16 were prepared in the same manner as in Organic EL device 2-1 except that the light emission host, the light emission dopant and the positive hole blocking agent were changed as shown in Table 2.

Thus prepared Organic EL Devices 2-1 to 2-16 were evaluated in the same manner as in Example 1. The obtained results are listed in Table 2. The externally talking out quantum efficiency and the light emission lifetime were represented by relative values when those of Organic EL Device 2-1 were set at 100.

TABLE 2

| Organic EL device No. | Light emission host | Light emission dopant | Positive hole blocking layer | Externally taking out quantum efficiency | Light emission lifetime ($\tau_{1/2}$) | Remarks |
|---|---|---|---|---|---|---|
| 2-1 | CBP | Ir-12 | BC | 100 | 100 | Comp. |
| 2-2 | CBP | Comp. 1 | BC | 95 | 220 | Comp. |
| 2-3 | CBP | Comp. 2 | BC | 100 | 260 | Comp. |
| 2-4 | CBP | Comp. 3 | BC | 112 | 310 | Comp. |
| 2-5 | CBP | Comp. 4 | BC | 104 | 370 | Comp. |
| 2-6 | CBP | 2-1 | BC | 135 | 740 | Inv. |
| 2-7 | CBP | 2-2 | BC | 127 | 720 | Inv. |
| 2-8 | CBP | 2-3 | BC | 124 | 710 | Inv. |
| 2-9 | CBP | 2-4 | BC | 128 | 700 | Inv. |
| 2-10 | H-1 | 2-6 | BC | 125 | 700 | Inv. |
| 2-11 | CBP | 2-7 | BC | 126 | 640 | Inv. |
| 2-12 | CBP | 2-11 | BC | 133 | 740 | Inv. |
| 2-13 | H-2 | 2-12 | E-1 | 131 | 810 | Inv. |
| 2-14 | CBP | 2-14 | BC | 126 | 650 | Inv. |
| 2-15 | CBP | 2-15 | BC | 128 | 610 | Inv. |
| 2-16 | CBP | 2-15 | E-2 | 131 | 780 | Inv. |

Comp.: Comparative, Inv.: Inventive

It is cleared from Table 2 that the higher light emission efficiency and longer light emission lifetime can be attained in the organic EL devices prepared by using the metal complex relating to the invention compared with the comparative organic EL devices.

Example 3

Preparation of Organic EL Device 3-1

A glass plate on which a layer of 150 nm of ITO as an anode (NA-45 manufactured by NH Techno Glass Corp.) was subjected to patterning. Thus obtained transparent substrate having the anode was washed by iso-propyl alcohol while applying ultrasonic waves, dried by dried nitrogen gas and subjected to UV ozone washing for 5 minutes. The resultant transparent substrate plate was fixed on the substrate holder of a vacuum evaporating deposition apparatus available on the market. Besides, five tantalum resistive heating boats were provided in the vacuum evaporating deposition apparatus (the first vacuum chamber). In each of boats, α-NPD, CBP, Ir-12, BC and Alq$_3$ were each charged, respectively.

Moreover, lithium fluoride and aluminum were each charged in a tantalum resistive heating boat and a tungsten resistive heating boat, respectively, and the boats were provided in the second vacuum chamber of the vacuum evaporating deposition apparatus.

The pressure in the first vacuum chamber was reduced by $4 \times 10^{-4}$ Pa and then the heating boat containing α-NPD was heated by applying electric current for evaporation depositing α-NPD on the transparent substrate plate in a deposition rate of from 0.1 nm/sec to 0.2 nm/sec to form a positive hole injection/transfer layer having a thickness of 20 nm.

After that, electric current was independently applied to the heating boat containing CBP and that containing Ir-12 while controlling the current so that the ratio of the deposition rate of CPB as the light emission host to that of Ir-12 as the light emission dopant was made to 100:6 to form a light emission layer having a thickness of 40 nm.

Then the heating boat containing BC was heated by applying electric current to provide a positive hole blocking layer having a thickness of 10 nm at a deposition rate of from 0.1 nm/sec to 0.2 nm/sec. Moreover, the heating boat containing Alq$_3$ was heated by applying electric current to provide an electron transfer layer having a thickness of 40 nm at a deposition rate of from 0.1 nm/sec to 0.2 nm/sec.

The device on which the layers until the electron transfer layer were formed was transferred to the second vacuum chamber while holding the vacuum, and then a rectangular stainless steel mask having a hole was positioned on the electron transfer layer by remote control from outside.

The pressured in the second vacuum chamber was reduced by $2 \times 10^{-4}$ Pa, and electric current was applied to the heating boat containing lithium fluoride to provide a cathode buffer layer having a thickness of 0.5 nm at a deposition rate of from 0.01 nm/sec to 0.02 nm/sec and then electric current was applied to the boat containing aluminum to form a cathode having a thickness of 150 nm at a deposition rate of from 1 nm/sec to 2 nm/sec. The device was transferred into the nitrogen gas atmosphere in the glove box in which the atmosphere was replaced by highly purified nitrogen gas of not less than 99.999% without contact to air and sealed in the same manner as in Organic EL Device 1-1 to prepare Organic EL Device 3-1.

<<Preparation of Organic EL Device 3-2 to 3-16>>

Organic EL Devices 3-2 to 3-16 were prepared in the same manner as in Organic EL device 3-1 except that the light emission host, the light emission dopant and the positive hole blocking agent were changed as shown in Table 3.

Thus prepared Organic EL Devices 3-1 to 3-16 were evaluated in the same manner as in Example 1. The results thus obtained are listed in Table 3. The externally taking out quantum efficiency and the light emission lifetime were represented by relative values when those of Organic EL Device 2-1 were set at 100.

TABLE 3

| Organic EL device No. | Light emission host | Light emission dopant | Positive hole blocking layer | Externally taking out quantum efficiency | Light emission lifetime ($\tau_{1/2}$) | Remarks |
|---|---|---|---|---|---|---|
| 3-1 | CBP | Ir-12 | BC | 100 | 100 | Comp. |
| 3-2 | CBP | Comp. 1 | BC | 95 | 210 | Comp. |
| 3-3 | CBP | Comp. 2 | BC | 105 | 240 | Comp. |
| 3-4 | CBP | Comp. 3 | BC | 104 | 370 | Comp. |
| 3-5 | CBP | Comp. 4 | BC | 110 | 350 | Comp. |
| 3-6 | CBP | 3-1 | BC | 127 | 740 | Inv. |
| 3-7 | CBP | 3-2 | BC | 127 | 730 | Inv. |
| 3-8 | CBP | 3-3 | BC | 121 | 710 | Inv. |
| 3-9 | CBP | 3-4 | BC | 125 | 710 | Inv. |
| 3-10 | H-1 | 3-6 | BC | 126 | 700 | Inv. |
| 3-11 | CBP | 3-7 | BC | 127 | 650 | Inv. |
| 3-12 | CBP | 3-11 | BC | 125 | 730 | Inv. |
| 3-13 | H-2 | 3-11 | E-1 | 130 | 780 | Inv. |
| 3-14 | CBP | 3-12 | BC | 131 | 800 | Inv. |
| 3-15 | CBP | 3-12 | E-2 | 131 | 840 | Inv. |
| 3-16 | CBP | 3-14 | E-2 | 121 | 690 | Inv. |

Comp.: Comparative, Inv.: Inventive

It is cleared from Table 3 that the higher light emission efficiency and longer light emission lifetime can be attained in the organic EL devices prepared by using the metal complex relating to the invention compared with the comparative organic EL devices.

Example 4

Preparation of Organic EL Device 4-1

A glass plate on which a layer of 150 nm of ITO as an anode (NA-45 manufactured by NH Techno Glass Corp.) was subjected to patterning. Thus obtained transparent substrate having the anode was washed by iso-propyl alcohol while applying ultrasonic waves, dried by dried nitrogen gas and subjected to UV ozone washing for 5 minutes. The resultant transparent substrate plate was fixed on the substrate holder of a vacuum evaporating deposition apparatus available on the market. Besides, five tantalum resistive heating boats were provided in the vacuum evaporating deposition apparatus (the first vacuum chamber). In each of boats, α-NPD, CBP, Ir-12, BC and Alq$_3$ were each charged, respectively.

Moreover, lithium fluoride and aluminum were each charged in a tantalum resistive heating boat and a tungsten resistive heating boat, respectively, and the boats were provided in the second vacuum chamber of the vacuum evaporating deposition apparatus.

The pressure in the first vacuum chamber was reduced by $4 \times 10^{-4}$ Pa and then the heating boat containing α-NPD was heated by applying electric current for evaporation depositing α-NPD on the transparent substrate plate in a deposition rate of from 0.1 nm/sec to 0.2 nm/sec to form a positive hole injection/transfer layer having a thickness of 50 nm.

After that, electric current was independently applied to the heating boat containing CBP and that containing Ir-12 while controlling the current so that the ratio of the deposition rate of CPB as the light emission host to that of Ir-12 as the light emission dopant was made to 100:5 to form a light emission layer having a thickness of 30 nm.

Then the heating boat containing BC was heated by applying electric current to provide a positive hole blocking layer having a thickness of 10 nm at a deposition rate of from 0.1 nm/sec to 0.2 nm/sec. Moreover, the heating boat containing Alq$_3$ was heated by applying electric current to provide an electron transfer layer having a thickness of 20 nm at a deposition rate of from 0.1 nm/sec to 0.2 nm/sec.

The device on which the layers until the electron transfer layer were formed was transferred to the second vacuum chamber while holding the vacuum, and then a rectangular stainless steel mask having a hole was positioned on the electron transfer layer by remote control from outside.

The pressured in the second vacuum chamber was reduced by $2 \times 10^{-4}$ Pa, and electric current was applied to the heating boat containing lithium fluoride to provide a cathode buffer layer having a thickness of 0.5 nm at a deposition rate of from 0.01 nm/sec to 0.02 nm/sec and then electric current was applied to the boat containing aluminum to form a cathode having a thickness of 150 nm at a deposition rate of from 1 nm/sec to 2 nm/sec. The device was transferred into the nitrogen gas atmosphere in the glove box in which the atmosphere was replaced by highly purified nitrogen gas of not less than 99.999% without contact with air and sealed in the same manner as in Organic EL Device 1-1 to prepare Organic EL Device 4-1.

<<Preparation of Organic EL Device 4-2 to 4-16>>

Organic EL Devices 4-2 to 4-16 were prepared in the same manner as in Organic EL device 4-1 except that the light emission host, the light emission dopant and the positive hole blocking agent were changed as shown in Table 4.

Thus prepared Organic EL Devices 4-1 to 4-16 were evaluated in the same manner as in Example 1. The results thus obtained are listed in Table 4. The externally taking out quantum efficiency and the light emission lifetime were represented by relative values when those of Organic EL Device 4-1 were set at 100.

TABLE 4

| Organic EL device No. | Light emission host | Light emission dopant | Positive hole blocking layer | Externally taking out quantum efficiency | Light emission lifetime ($\tau_{1/2}$) | Remarks |
|---|---|---|---|---|---|---|
| 4-1 | CBP | Ir-12 | BC | 100 | 100 | Comp. |
| 4-2 | CBP | Comp. 1 | BC | 94 | 210 | Comp. |
| 4-3 | CBP | Comp. 2 | BC | 98 | 240 | Comp. |
| 4-4 | CBP | Comp. 3 | BC | 105 | 340 | Comp. |
| 4-5 | CBP | Comp. 4 | BC | 105 | 370 | Comp. |
| 4-6 | CBP | 4-1 | BC | 128 | 800 | Inv. |
| 4-7 | CBP | 4-2 | BC | 126 | 780 | Inv. |
| 4-8 | CBP | 4-3 | BC | 120 | 770 | Inv. |
| 4-9 | CBP | 4-4 | BC | 124 | 750 | Inv. |
| 4-10 | H-1 | 4-6 | BC | 125 | 610 | Inv. |
| 4-11 | CBP | 4-7 | BC | 126 | 580 | Inv. |
| 4-12 | CBP | 4-11 | BC | 125 | 820 | Inv. |
| 4-13 | H-2 | 4-12 | E-1 | 134 | 810 | Inv. |
| 4-14 | CBP | 4-13 | BC | 132 | 690 | Inv. |
| 4-15 | CBP | 4-14 | BC | 122 | 590 | Inv. |
| 4-16 | CBP | 4-14 | E-2 | 135 | 680 | Inv. |

Comp.: Comparative, Inv.: Inventive

It is cleared from Table 4 that the higher light emission efficiency and longer light emission lifetime can be attained in the organic EL devices prepared by using the metal complex relating to the invention compared with the comparative organic EL devices.

Example 5

Preparation of Organic EL Device 5-1

A glass plate on which a layer of 150 nm of ITO as an anode (NA-45 manufactured by NH Techno Glass Corp.) was subjected to patterning. Thus obtained transparent substrate having the anode was washed by iso-propyl alcohol while applying ultrasonic waves, dried by dried nitrogen gas and subjected to UV ozone washing for 5 minutes. The resultant transparent substrate plate was fixed on the substrate holder of a vacuum evaporating deposition apparatus available on the market. Besides, five tantalum resistive heating boats were provided in the vacuum evaporating deposition apparatus (the first vacuum chamber). In each of boats, α-NPD, CBP, Ir-12, BC and Alq$_3$ were each charged, respectively.

Moreover, lithium fluoride and aluminum were each charged in a tantalum resistive heating boat and a tungsten resistive heating boat, respectively, and the boats were provided in the second vacuum chamber of the vacuum evaporating deposition apparatus.

The pressure in the first vacuum chamber was reduced by $4 \times 10^{-4}$ Pa and then the heating boat containing α-NPD was heated by applying electric current for evaporation depositing α-NPD on the transparent substrate plate in a deposition rate of from 0.1 nm/sec to 0.2 nm/sec to form a positive hole injection/transfer layer having a thickness of 60 nm.

After that, electric current was independently applied to the heating boat containing CBP and that containing Ir-12 while controlling the current so that the ratio of the deposition rate of CPB as the light emission host to that of Ir-12 as the light emission dopant was made to 100:5 to form a light emission layer having a thickness of 25 nm.

Then the heating boat containing BC was heated by applying electric current to provide a positive hole blocking layer having a thickness of 10 nm at a deposition rate of from 0.1 nm/sec to 0.2 nm/sec. Moreover, the heating boat containing Alq$_3$ was heated by applying electric current to provide an electron transfer layer having a thickness of 15 nm at a deposition rate of from 0.1 nm/sec to 0.2 nm/sec.

The device on which the layers until the electron transfer layer were formed was transferred to the second vacuum chamber while holding the vacuum, and then a rectangular stainless steel mask having a hole was positioned on the electron transfer layer by remote control from outside.

The pressured in the second vacuum chamber was reduced by $2 \times 10^{-4}$ Pa, and electric current was applied to the heating boat containing lithium fluoride to provide a cathode buffer layer having a thickness of 0.5 nm at a deposition rate of from 0.01 nm/sec to 0.02 nm/sec and then electric current was applied to the boat containing aluminum to form a cathode having a thickness of 150 nm at a deposition rate of from 1 nm/sec to 2 nm/sec. The device was transferred into the nitrogen gas atmosphere in the glove box in which the atmosphere was replaced by highly purified nitrogen gas of not less than 99.999% without contact to air and sealed in the same manner as in Organic EL Device 1-1 to prepare Organic EL Device 5-1.

<<Preparation of Organic EL Device 5-2 to 5-15>>

Organic EL Devices 5-2 to 5-15 were prepared in the same manner as in Organic EL device 5-1 except that the light emission host, the light emission dopant and the positive hole blocking agent were changed as shown in Table 5.

Thus prepared Organic EL Devices 5-1 to 5-15 were evaluated in the same manner as in Example 1. The results thus obtained are listed in Table 5. The externally taking out quantum efficiency and the light emission lifetime were represented by relative values when those of Organic EL Device 5-1 were set at 100.

TABLE 5

| Organic EL device No. | Light emission host | Light emission dopant | Positive hole blocking layer | Externally taking out quantum efficiency | Light emission lifetime ($\tau_{1/2}$) | Remarks |
|---|---|---|---|---|---|---|
| 5-1 | CBP | Ir-12 | BC | 100 | 100 | Comp. |
| 5-2 | CBP | Comp. 1 | BC | 96 | 190 | Comp. |
| 5-3 | CBP | Comp. 2 | BC | 100 | 220 | Comp. |
| 5-4 | CBP | Comp. 3 | BC | 110 | 360 | Comp. |
| 5-5 | CBP | Comp. 4 | BC | 105 | 370 | Comp. |
| 5-6 | CBP | 5-1 | BC | 129 | 750 | Inv. |
| 5-7 | CBP | 5-2 | BC | 129 | 720 | Inv. |
| 5-8 | CBP | 5-4 | BC | 127 | 640 | Inv. |
| 5-9 | CBP | 5-5 | BC | 131 | 690 | Inv. |
| 5-10 | H-1 | 5-7 | BC | 125 | 610 | Inv. |
| 5-11 | CBP | 5-11 | BC | 122 | 820 | Inv. |
| 5-12 | CBP | 5-11 | E-1 | 130 | 840 | Inv. |
| 5-13 | CBP | 5-14 | BC | 120 | 620 | Inv. |
| 5-14 | H-2 | 5-15 | BC | 130 | 550 | Inv. |
| 5-15 | H-2 | 5-15 | E-2 | 135 | 650 | Inv. |

Comp.: Comparative, Inv.: Inventive

It is cleared from Table 5 that the higher light emission efficiency and longer light emission lifetime can be attained in the organic EL devices prepared by using the metal complex relating to the invention compared with the comparative organic EL devices.

Example 6

Preparation of Organic EL Device 6-1

A glass plate on which a layer of 150 nm of ITO as an anode (NA-45 manufactured by NH Techno Glass Corp.) was subjected to patterning. Thus obtained transparent substrate having the anode was washed by iso-propyl alcohol while applying ultrasonic waves, dried by dried nitrogen gas and subjected to UV ozone washing for 5 minutes. The resultant transparent substrate plate was fixed on the substrate holder of a vacuum evaporating deposition apparatus available on the market. Besides, five tantalum resistive heating boats were provided in the vacuum evaporating deposition apparatus (the first vacuum chamber). In each of boats, α-NPD, CBP, Ir-12, BC and Alq$_3$ were each charged, respectively.

Moreover, lithium fluoride and aluminum were each charged in a tantalum resistive heating boat and a tungsten resistive heating boat, respectively, and the boats were provided in the second vacuum chamber of the vacuum evaporating deposition apparatus.

The pressure in the first vacuum chamber was reduced by 4×10$^{-4}$ Pa and then the heating boat containing α-NPD was heated by applying electric current for evaporation depositing α-NPD on the transparent substrate plate in a deposition rate of from 0.1 nm/sec to 0.2 nm/sec to form a positive hole injection/transfer layer having a thickness of 40 nm.

After that, electric current was independently applied to the heating boat containing CBP and that containing Ir-12 while controlling the current so that the ratio of the deposition rate of CPU as the light emission host to that of Ir-12 as the light emission dopant was made to 100:5 to form a light emission layer having a thickness of 30 nm.

Then the heating boat containing BC was heated by applying electric current to provide a positive hole blocking layer having a thickness of 10 nm at a deposition rate of from 0.1 nm/sec to 0.2 nm/sec. Moreover, the heating boat containing Alq$_3$ was heated by applying electric current to provide an electron transfer layer having a thickness of 30 nm at a deposition rate of from 0.1 nm/sec to 0.2 nm/sec.

The device on which the layers until the electron transfer layer were formed was transferred to the second vacuum chamber while holding the vacuum, and then a rectangular stainless steel mask having a hole was positioned on the electron transfer layer by remote control from outside.

The pressured in the second vacuum chamber was reduced by 2×10$^{-4}$ Pa, and electric current was applied to the heating boat containing lithium fluoride to provide a cathode buffer layer having a thickness of 0.5 nm at a deposition rate of from 0.01 nm/sec to 0.02 nm/sec and then electric current was applied to the boat containing aluminum to form a cathode having a thickness of 150 nm at a deposition rate of from 1 nm/sec to 2 nm/sec. The device was transferred into the nitrogen gas atmosphere in the glove box in which the atmosphere was replaced by highly purified nitrogen gas of not less than 99.999% without contact to air and sealed in the same manner as in Organic EL Device 1-1 to prepare Organic EL Device 6-1.

<<Preparation of Organic EL Device 6-2 to 6-15>>

Organic EL Devices 6-2 to 6-15 were prepared in the same manner as in Organic EL device 6-1 except that the light emission host, the light emission dopant and the positive hole blocking agent were changed as shown in Table 6.

Thus prepared Organic EL Devices 6-1 to 3-15 were evaluated in the same manner as in Example 1 and obtained results are listed in Table 6. The externally taking out quantum efficiency and the light emission lifetime were represented by relative values when those of Organic EL Device 6-1 were set at 100.

TABLE 6

| Organic EL device No. | Light emission host | Light emission dopant | Positive hole blocking layer | Externally taking out quantum efficiency | Light emission lifetime ($\tau_{1/2}$) | Remarks |
|---|---|---|---|---|---|---|
| 6-1 | CBP | Ir-12 | BC | 100 | 100 | Comp. |
| 6-2 | CBP | Comp. 1 | BC | 92 | 240 | Comp. |
| 6-3 | CBP | Comp. 2 | BC | 105 | 310 | Comp. |
| 6-4 | CBP | Comp. 3 | BC | 104 | 340 | Comp. |
| 6-5 | CBP | Comp. 4 | BC | 107 | 380 | Comp. |
| 6-6 | CBP | 6-1 | BC | 130 | 760 | Inv. |
| 6-7 | CBP | 6-2 | BC | 126 | 740 | Inv. |
| 6-8 | CBP | 6-3 | BC | 124 | 650 | Inv. |
| 6-9 | CBP | 6-4 | BC | 124 | 620 | Inv. |
| 6-10 | H-1 | 6-6 | BC | 127 | 580 | Inv. |
| 6-11 | CBP | 6-7 | BC | 124 | 550 | Inv. |
| 6-12 | CBP | 6-7 | E-1 | 128 | 650 | Inv. |
| 6-13 | CBP | 6-11 | BC | 124 | 860 | Inv. |
| 6-14 | H-2 | 6-14 | BC | 122 | 590 | Inv. |
| 6-15 | H-2 | 6-14 | E-2 | 129 | 620 | Inv. |

Comp.: Comparative, Inv.: Inventive

It is cleared from Table 6 that the higher light emission efficiency and longer light emission lifetime can be attained in the organic EL devices prepared by using the metal complex relating to the invention compared with the comparative organic EL devices.

Example 7

Preparation of Organic EL Device 7-1

A glass plate on which a layer of 150 nm of ITO as an anode (NA-45 manufactured by NH Techno Glass Corp.) was subjected to patterning. Thus obtained transparent substrate having the anode was washed by iso-propyl alcohol while applying ultrasonic waves, dried by dried nitrogen gas and subjected to UV ozone washing for 5 minutes. The resultant transparent substrate plate was fixed on the substrate holder of a vacuum evaporating deposition apparatus available on the market. Besides, five tantalum resistive heating boats were provided in the vacuum evaporating deposition apparatus (the first vacuum chamber). In each of boats, α-NPD, CBP, Ir-12, BC and Alq$_3$ were each charged, respectively.

Moreover, lithium fluoride and aluminum were each charged in a tantalum resistive heating boat and a tungsten resistive heating boat, respectively, and the boats were provided in the second vacuum chamber of the vacuum evaporating deposition apparatus.

The pressure in the first vacuum chamber was reduced by 4×10$^{-4}$ Pa and then the heating boat containing α-NPD was heated by applying electric current for evaporation depositing α-NPD on the transparent substrate plate in a deposition rate of from 0.1 nm/sec to 0.2 nm/sec to form a positive hole injection/transfer layer having a thickness of 30 nm.

After that, electric current was independently applied to the heating boat containing CBP and that containing Ir-12 while controlling the current so that the ratio of the deposition rate of CPB as the light emission host to that of Ir-12 as the light emission dopant was made to 100:6 to form a light emission layer having a thickness of 30 nm.

Then the heating boat containing BC was heated by applying electric current to provide a positive hole blocking layer having a thickness of 10 nm at a deposition rate of from 0.1 nm/sec to 0.2 nm/sec. Moreover, the heating boat containing Alq$_3$ was heated by applying electric current to provide an electron transfer layer having a thickness of 40 nm at a deposition rate of from 0.1 nm/see to 0.2 nm/sec.

The device on which the layers until the electron transfer layer were formed was transferred to the second vacuum chamber while holding the vacuum, and then a rectangular stainless steel mask having a hole was positioned on the electron transfer layer by remote control from outside.

The pressured in the second vacuum chamber was reduced by 2×10$^{-4}$ Pa, and electric current was applied to the heating boat containing lithium fluoride to provide a cathode buffer layer having a thickness of 0.5 nm at a deposition rate of from 0.01 nm/sec to 0.02 nm/sec and then electric current was applied to the boat containing aluminum to form a cathode having a thickness of 150 nm at a deposition rate of from 1 nm/sec to 2 nm/sec. The device was transferred into the nitrogen gas atmosphere in the glove box in which the atmosphere was replaced by highly purified nitrogen gas of not less than 99.999% without contact to air and sealed in the same manner as in Organic EL Device 1-1 to prepare Organic EL Device 7-1.

<<Preparation of Organic EL Device 7-2 to 7-19>>

Organic EL Devices 7-2 to 7-19 were prepared in the same manner as in Organic EL device 7-1 except that the light emission host, the light emission dopant and the positive hole blocking agent were changed as shown in Table 7.

Thus prepared Organic EL Devices 7-1 to 7-19 were evaluated in the same manner as in Example 1. The results thus obtained are listed in Table 7. The externally taking out quantum efficiency and the light emission lifetime were represented by relative values when those of Organic EL Device 7-1 were set at 100,

TABLE 7

| Organic EL device No. | Light emission host | Light emission dopant | Positive hole blocking layer | Externally taking out quantum efficiency | Light emission lifetime ($\tau_{1/2}$) | Remarks |
|---|---|---|---|---|---|---|
| 7-1 | CBP | Ir-12 | BC | 100 | 100 | Comp. |
| 7-2 | CBP | Comp. 1 | BC | 95 | 187 | Comp. |
| 7-3 | CBP | Comp. 2 | BC | 101 | 220 | Comp. |
| 7-4 | CBP | Comp. 3 | BC | 107 | 320 | Comp. |
| 7-5 | CBP | Comp. 4 | BC | 105 | 350 | Comp. |
| 7-6 | CBP | 7-1 | BC | 120 | 820 | Inv. |
| 7-7 | CBP | 7-2 | BC | 124 | 810 | Inv. |
| 7-8 | CBP | 7-3 | BC | 120 | 810 | Inv. |
| 7-9 | CBP | 7-4 | BC | 123 | 800 | Inv. |
| 7-10 | H-1 | 7-5 | BC | 121 | 760 | Inv. |
| 7-11 | CBP | 7-6 | BC | 124 | 720 | Inv. |
| 7-12 | CBP | 7-7 | BC | 124 | 640 | Inv. |
| 7-13 | CBP | 7-7 | E-1 | 130 | 670 | Inv. |
| 7-14 | H-2 | 7-11 | E-1 | 122 | 850 | Inv. |
| 7-15 | CBP | 7-12 | BC | 121 | 590 | Inv. |
| 7-16 | CBP | 7-13 | BC | 130 | 780 | Inv. |
| 7-17 | CBP | 7-13 | E-2 | 135 | 810 | Inv. |
| 7-18 | CBP | 7-14 | E-2 | 127 | 750 | Inv. |
| 7-19 | CBP | 7-15 | E-2 | 130 | 700 | Inv. |

Comp.: Comparative, Inv.: Inventive

It is cleared from Table 1 that the higher light emission efficiency and longer light emission lifetime can be attained in the organic EL devices prepared by using the metal complex relating to the invention compared with the comparative organic EL devices.

Example 8

On a glass substrate having a size of 25 mm×25 mm×0.5 mm, an indium tin oxide anode (a mole ratio of ITO/tin of 95/5) having a thickness of 200 nm was formed by spattering method using direct electric current. The surface resistance of the anode was 10Ω/□. A dichloroethane solution of polyvinylcarbazole, Ir-13 and 2-(4-biphenylyl)-5-(4-t-butylphenyl)-1,3,4-oxadiazole in a mole ratio of 200/5/59 was coated by a spin coater on the anode to form a light emission layer having a thickness of 100 nm. On the organic compound layer, a patterned mask to make a light emission area of 5 mm×5 mm was provided, and then a cathode buffer layer of lithium fluoride of 0.5 nm and a cathode of aluminum of 150 nm were formed.

Thus prepared device was transferred into a glove box, which was filled by highly purified nitrogen gas of 99.999% or more, without contacting to air and sealed in the same manner as in Organic EL Device 1-1 to prepare Organic EL Device 8-1.

<<Preparation of Organic EL Devices 8-2 to 8-9>>

Organic EL Devices 8-2 to 8-9 were prepared in the same manner as in Organic EL Device 8-1 except that the light emission dopant was changed as shown in Table 8.

<<Evaluation of Organic EL Devices>>

The luminance of emitted light and light emission efficiency of each of Organic EL Devices 8-1 to 3-9 was measured as follows.

(Luminance of Emitted Light and Light Emission Efficiency)

The organic EL device was driven by applying direct electric current voltage by the use of Source Measure Unit 2400, manufactured by Toyo Corp., and the luminance of emitted light ($Cd/cm^2$) when a direct current voltage of 10 V was applied and the light emission efficiency (ml/W) when an electric current of 2.5 $mA/cm^2$ was applied ware measured.

Thus obtained results are listed in Table 8.

TABLE 8

| Organic device No. | Light emission dopant | Luminance of emitted light ($Cd/m^2$) | Light emission efficiency (lm/W) | Remarks |
|---|---|---|---|---|
| 8-1 | Ir-13 | 100 | 100 | Comparative |
| 8-2 | Comparative 1 | 105 | 110 | Inventive |
| 8-3 | 1-11 | 130 | 128 | Inventive |
| 8-4 | 2-12 | 132 | 127 | Inventive |
| 8-5 | 3-1 | 128 | 130 | Inventive |
| 8-6 | 4-4 | 131 | 129 | Inventive |
| 8-7 | 5-5 | 132 | 131 | Inventive |
| 8-8 | 6-7 | 128 | 129 | Inventive |
| 8-9 | 7-3 | 130 | 129 | Inventive |

It is cleared from Table 1 that the higher light emission efficiency and higher luminance can be attained in the organic EL devices prepared by using the metal complex relating to the invention compared with the comparative organic EL devices.

Example 9

Preparation of Full Color Display (Preparation of Blue Light Emission Device)

Organic EL Device 1-10 of Example 1 was used as the blue light emission EL device.

(Preparation of Green Light Emission Device)

An organic EL device prepared in the same manner as Organic EL Device 1-1 except that Ir-12 was replaced by Ir-1 was used as the green light emission EL element.

(Preparation of Red Light Emission Device)

An organic EL device prepared in the same manner as Organic EL Device 1-1 except that Ir-12 was replaced by Ir-9 was used as the red light emission EL element.

The above prepared red, green and blue light emission EL devices were oriented on the same substrate to prepare an active matrix type full color as shown in FIG. 1. In FIG. 2, a schematic drawing of the displaying part A of thus prepared display is displayed. The displaying part A had a wiring containing plural scanning lines 5 and data lines 6 and plural pixel 3 (pixels respectively emitting light of red, green and blue region) oriented on the same plane. The scanning lines 5 and data lines 6 of the wiring were composed of an electro-conductive material and crossed at right angle in a grid form and connected to the pixel 3 at the crossing point (details are not displayed). The pixel 3 was driven by the active matrix system composed of the organic el device corresponding to each of the colors, a switching transistor as the active element and a driving transistor. The organic EL device received image data from the date line 6 when a scanning signal was applied from the scanning line 5 and emitted light according to the received data signal. The full color display was constituted by suitably orienting the red, green and blue pixels as above.

It was understood by driving the full color display that the display had high luminance and high durability and clear color moving image could be obtained.

Example 10

White Light Emission Device and Preparation Thereof

An electrode was patterned on the transparent electrode substrate the same as in Example 1 of 20 mm×20 mm. On the electrode, α-NPD layer of 25 nm was formed as a positive hole injection/transfer layer the same as in Example 1, and the heating boats each containing CBP, Compound 2-1 of the invention and Ir-9, respectively, were each independently heated by applying electric current so that the ratio of the deposition rate of CPB as the light emission host, the compound 2-1 of the invention as the light emission dopant and Ir-9 became 100:5:0.6 to form a light emission layer having a thickness of 30 nm.

Then a positive hole blocking layer of BC having a thickness of 10 nm was formed. Furthermore, an electron transfer layer of Alq$_3$ having a thickness of 40 nm was formed was formed.

After that, a square holed steel having a shape almost the same as that of the transparent electrode was provided on the electron injection layer in the same manner as in Example 1 and a cathode buffer layer of lithium fluoride of 0.5 nm and a cathode of aluminum layer of 150 nm were formed by vapor deposition.

A flat lamp was prepared, which was sealed in the same manner and structure as in Example 1 was prepared. Almost white light was obtained when applying the electric current to the flat lamp, and it was understood that the lamp could be used as an illuminating device.

The invention claimed is:

1. An organic luminescent device having at least a light emission layer placed between an anode and a cathode, wherein the light emission layer contains an emission host and an emission dopant,
   wherein the emission dopant is a metal complex having a partial structure represented by Formula (2), and a mixing ratio of the emission dopant to the emission host is 0.1 to 30 weight %

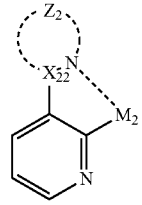

Formula (2)

wherein,
$Z_2$ is a group of atoms necessary for forming an aromatic heterocyclic ring together with a N atom and $X_{22}$,
$X_{22}$ is a carbon atom or a nitrogen atom,
the formed aromatic heterocyclic ring is selected from the group consisting of pyrazole, oxazole, thiazole, tetrazole, pyridazine, pyrazine and triazine, and
$M_2$ is a metal element of Group VIII of the periodic table.

2. The organic luminescent device of claim 1, wherein the metal element of Group VIII is iridium or platinum.

3. The organic luminescent device of claim 1, which comprises a positive hole blocking layer as a constitution layer placed between the light emission layer and the cathode, wherein the positive hole blocking layer contains a carboline derivative or a derivative having a ring structure in which at least one of the carbon atoms of the hydrocarbon ring constituting the carboline ring of the carboline derivative is substituted by a nitrogen atom.

4. A display having the organic luminescent device of claim 1.

5. An illumination device having the organic luminescent device of claim 1.

6. The organic luminescent device of claim 1, wherein the emission host is selected from the group consisting of a carbazole derivative, a triarylamine derivative, an aromatic borane derivative, a nitrogen-containing heterocyclic derivative, a thiophene derivative, a furan derivative and an oligoarylene compound, and a carboline derivative, or derivative having a ring structure in which at least one of carbon atoms of the hydrocarbon ring constituting the carboline ring of the carboline derivative is substituted by a nitrogen atom.

* * * * *